(12) United States Patent
You et al.

(10) Patent No.: US 11,450,662 B2
(45) Date of Patent: Sep. 20, 2022

(54) GATE ISOLATION STRUCTURE

(71) Applicant: Taiwan Semiconductor Manufacturing Co., Ltd., Hsinchu (TW)

(72) Inventors: Jia-Chuan You, Taoyuan County (TW); Chia-Hao Chang, Hsinchu (TW); Kuo-Cheng Chiang, Hsinchu County (TW); Kuan-Lun Cheng, Hsin-Chu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/952,812

(22) Filed: Nov. 19, 2020

(65) Prior Publication Data

US 2022/0045051 A1   Feb. 10, 2022

Related U.S. Application Data

(60) Provisional application No. 63/306,654, filed on Aug. 10, 2020.

(51) Int. Cl.
| | |
|---|---|
| *H01L 27/088* | (2006.01) |
| *H01L 29/786* | (2006.01) |
| *H01L 21/8234* | (2006.01) |
| *H01L 29/423* | (2006.01) |

(52) U.S. Cl.
CPC .. *H01L 27/0886* (2013.01); *H01L 21/823437* (2013.01); *H01L 21/823481* (2013.01); *H01L 29/42392* (2013.01); *H01L 29/78696* (2013.01)

(58) Field of Classification Search
CPC ......... H01L 21/823481; H01L 27/0886; H01L 29/42392; H01L 21/764; H01L 2029/7858
See application file for complete search history.

(56) References Cited

U.S. PATENT DOCUMENTS

| | | | |
|---|---|---|---|
| 9,818,872 B2 | 11/2017 | Ching et al. | |
| 9,887,269 B2 | 2/2018 | Ching et al. | |
| 9,899,398 B1 | 2/2018 | Colinge et al. | |
| 10,032,627 B2 | 7/2018 | Lee et al. | |
| 10,109,721 B2 | 10/2018 | Lin et al. | |
| 10,157,799 B2 | 12/2018 | Ching et al. | |
| 10,199,502 B2 | 2/2019 | Huang et al. | |
| 10,290,546 B2 | 5/2019 | Chiang et al. | |
| 10,475,902 B2 | 11/2019 | Lee et al. | |
| 10,510,620 B1 * | 12/2019 | Chanemougame | ........................ H01L 29/0692 |
| 2005/0266645 A1 | 12/2005 | Park | |
| 2017/0141210 A1 | 5/2017 | Yang | |

(Continued)

FOREIGN PATENT DOCUMENTS

| | | |
|---|---|---|
| DE | 102018101016 A1 | 4/2019 |
| KR | 20190140647 | 12/2019 |

*Primary Examiner* — Changhyun Yi
(74) *Attorney, Agent, or Firm* — Haynes and Boone, LLP

(57) ABSTRACT

A semiconductor device according to the present disclosure includes a first gate structure and a second gate structure aligned along a direction, a first metal layer disposed over the first gate structure, a second metal layer disposed over the second gate structure, and a gate isolation structure extending between the first gate structure and the second gate structure as well as between the first metal layer and the second metal layer.

20 Claims, 32 Drawing Sheets

(56) References Cited

U.S. PATENT DOCUMENTS

| | | |
|---|---|---|
| 2018/0175036 A1 | 6/2018 | Ching et al. |
| 2019/0252268 A1 | 8/2019 | Xie et al. |
| 2019/0305111 A1 | 10/2019 | Subramanian et al. |
| 2019/0378903 A1 | 12/2019 | Jeon et al. |
| 2020/0035705 A1* | 1/2020 | Kim .................. H01L 27/11807 |
| 2020/0066718 A1 | 2/2020 | Li et al. |
| 2020/0098878 A1 | 3/2020 | Guler et al. |
| 2020/0105613 A1 | 4/2020 | Hung et al. |

\* cited by examiner

GATE ISOLATION STRUCTURE

PRIORITY DATA

This application claims priority to U.S. Provisional Patent Application No. 63/063,654, filed on Aug. 10, 2020, entitled "Gate Isolation Structure", the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, or other nanostructures and for that reasons, an MBC transistor may also be referred to as a nanowire transistor or a nanosheet transistor.

Gate cut features or dielectric fins of multi-gate transistors define fill window for the gate structures. When a width of a gate cut feature or a dielectric fin is increased to reduce parasitic capacitance between adjacent gate structures, the gate fill window may be reduced, making it difficult to form satisfactory gate structures. While conventional gate cut features or dielectric fins are generally satisfactory for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
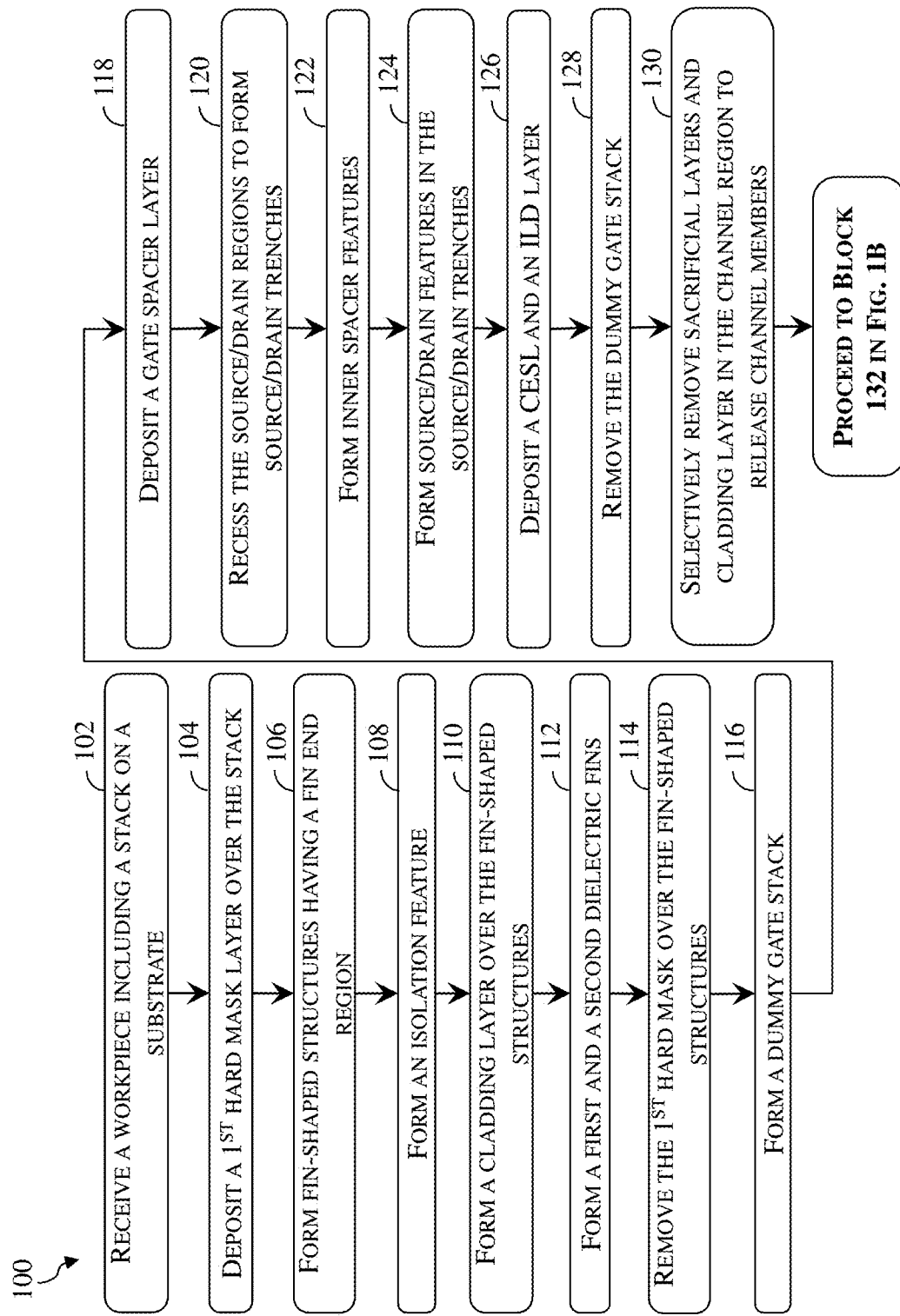
FIGS. 1A and 1B collectively illustrates a flowchart of a method for forming a semiconductor device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to isolation structures to reduce parasitic capacitance, and more particularly to isolation structures disposed between gate structures.

For multi-gate transistors, such as FinFETs or MBC transistors, gate cut features (or dielectric fins) are used to form isolated gate structures. Because a dielectric fin rises above the active regions, after gate structure layers are deposited and planarized, the dielectric fin divides the gate structure layers into two gate structures. As device dimensions continue to shrink, parasitic capacitance among adjacent device features drags down device performance. For example, adjacent gate structures may harbor parasitic capacitance that slows down the switching speed. While dielectric fins may be made wider to increase the distance between adjacent gate structures, such increase in dimension is against the general trend and the fill window for the gate structures may need to be shrunken to compensate for the wider dielectric fin. The smaller fill window may lead to reduced process window in forming gate structures and lowered yield.

The present disclosure provides methods of forming a gate isolation structure that reduces the gate-to-gate parasitic capacitance without sacrificing gate formation windows and yield. Methods of the present disclosure include formation of a dielectric fin, depositing gate structure layers over the dielectric fin, planarization of the gate structure layers to form gate structures, selective deposition of a metal layer on the gate structures, removal of the dielectric fin to form an isolation trench, and formation of a gate isolation structure in the isolation trench. The removal of the dielectric fin also removes a portion of the gate dielectric layers in the gate structures such that the gate isolation structures are in direct contact with gate electrode layers of the gate structures. The gate isolation includes a lower portion between the gate structures and an upper portion disposed between portions of the metal layer. In some instances, along a direction between the gate structures, a width of the lower portion is greater than a width of the upper portion. Compared to the dielectric fin, the gate isolation structure of the present disclosure is wider and reduces gate-to-gate parasitic capacitance while the gate fill window remains the same.

Figure 1B:
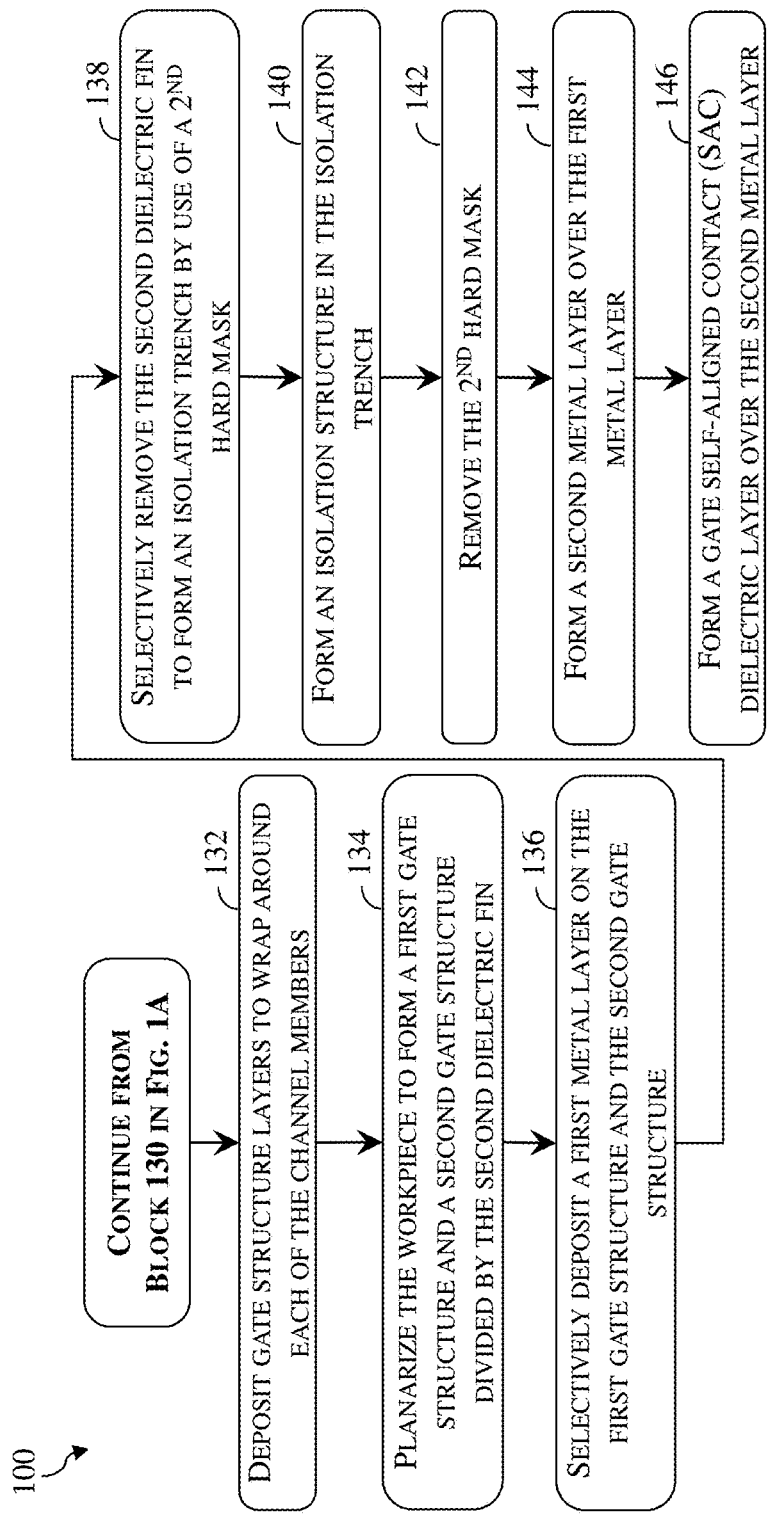

The various aspects of the present disclosure will now be described in more detail with reference to the figures. FIGS. 1A and 1B collectively illustrate a flowchart of a method 100 of forming a semiconductor device. Method 100 is merely an example and is not intended to limit the present disclosure to what is explicitly illustrated in method 100. Additional steps may be provided before, during and after method 100, and some steps described can be replaced, eliminated, or moved around for additional embodiments of the methods. Not all steps are described herein in detail for reasons of simplicity. Method 100 is described below in conjunction with FIGS. 2-31, which illustrate fragmentary perspective or cross-sectional views of a workpiece 200 at different stages of fabrication according to embodiments of method 100. Because a semiconductor device will be formed from the workpiece 200, the workpiece 200 may be referred to as a semiconductor device 200 as the context requires. Although embodiments that include MBC transistors are illustrated in the figures, the present disclosure is not so limited and may be applicable to other multi-gate devices, such as FinFETs. Throughout FIGS. 2-31, the X direction, the Y direction, and the Z direction are perpendicular to one another and are used consistently. For example, the X direction in one figure is parallel to the X direction in a different figure. Additionally, throughout the present disclosure, like reference numerals are used to denote like features.

Figure 2:
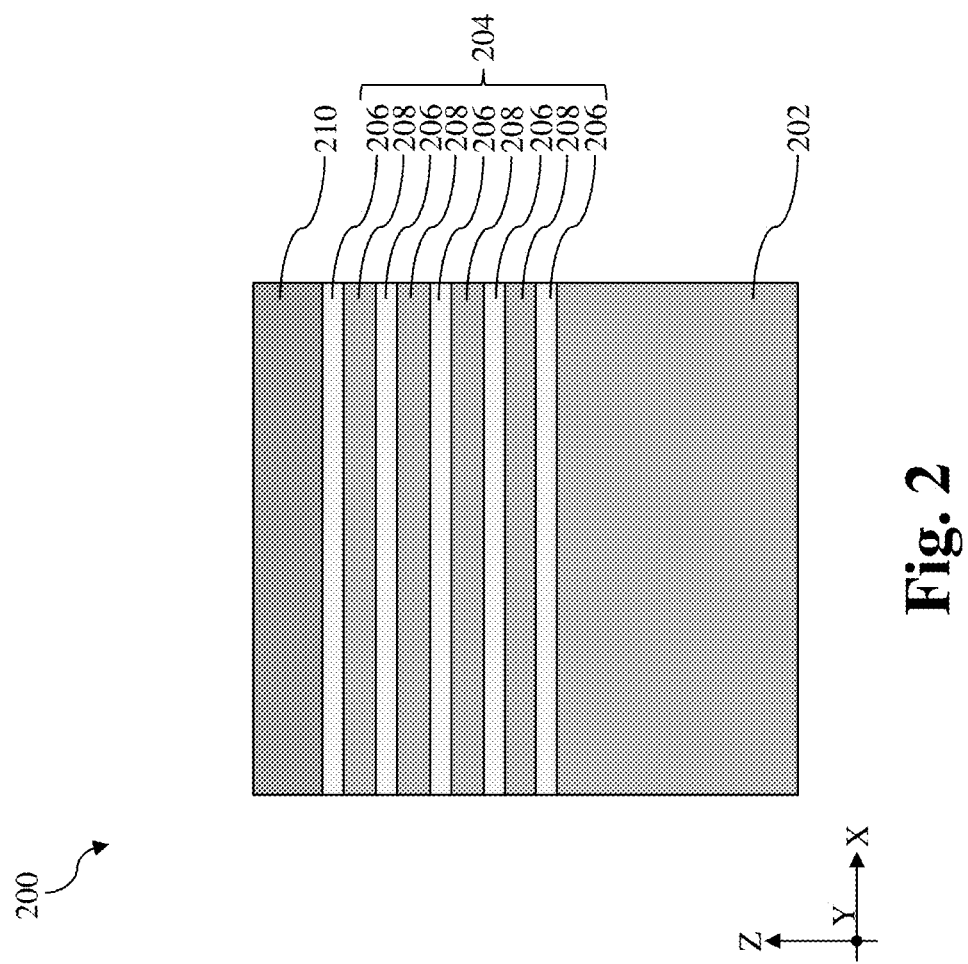
FIGS. 2-31 illustrate fragmentary perspective views or cross-sectional views of a workpiece during various fabrication stages in the method of FIGS. 1A and 1B, according to one or more aspects of the present disclosure.

Referring to FIGS. 1A and 2, method 100 includes a block 102 where a workpiece 200 is received. As shown in FIG. 2, the workpiece 200 includes a substrate 202 and a stack 204 disposed on the substrate 202. In one embodiment, the substrate 202 may be a silicon (Si) substrate. In some other embodiments, the substrate 202 may include other semiconductor materials such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 202 may also include an insulating layer, such as a silicon oxide layer, to have a silicon-on-insulator (SOI) structure or a germanium-on-insulator (GeOI) structure. In some embodiments, the substrate 202 may include one or more well regions, such as n-type well regions doped with an n-type dopant (i.e., phosphorus (P) or arsenic (As)) or p-type well regions doped with a p-type dopant (i.e., boron (B)), for forming different types of devices. The doping the n-type wells and the p-type wells may be formed using ion implantation or thermal diffusion.

Referring still to FIG. 2, the stack 204 may include a plurality of channel layers 208 interleaved by a plurality of sacrificial layers 206. The channel layers 208 and the sacrificial layers 206 may have different semiconductor compositions. In some implementations, the channel layers 208 are formed of silicon (Si) and sacrificial layers 206 are formed of silicon germanium (SiGe). In these implementations, the additional germanium content in the sacrificial layers 206 allow selective removal or recess of the sacrificial layers 206 without substantial damages to the channel layers 208. In some embodiments, the sacrificial layers 206 and channel layers 208 may be deposited using an epitaxial process. The stack 204 may be epitaxially deposited using CVD deposition techniques (e.g., vapor-phase epitaxy (VPE) and/or ultra-high vacuum CVD (UHV-CVD)), molecular beam epitaxy (MBE), and/or other suitable processes. The sacrificial layers 206 and the channel layers 208 are deposited alternatingly, one-after-another, to form the stack 204. It is noted that five (5) layers of the sacrificial layers 206 and four (4) layers of the channel layers 208 are alternately and vertically arranged as illustrated in FIG. 2, which is for illustrative purposes only and not intended to be limiting beyond what is specifically recited in the claims. The number of layers depends on the desired number of channels members for the semiconductor device 200. In some embodiments, the number of the channel layers 208 is between 2 and 10.

Referring to FIGS. 1A and 2, method 100 includes a block 104 where a first hard mask layer 210 is deposited over the stack 204. The first hard mask layer 210 serves as an etch mask to pattern the stack 204 and a portion of the substrate 202. In some embodiments, the first hard mask layer 210 may be deposited using CVD, plasma-enhanced CVD (PECVD, atomic layer deposition (ALD), plasma-enhanced ALD (PEALD), or a suitable deposition method. The first hard mask layer 210 may be a single layer or a multilayer. When the first hard mask layer 210 is a multi-layer, the first hard mask layer 210 includes a first layer and a second layer disposed over the first layer. In one embodiment, the first layer may be a pad oxide and the second layer may be a pad nitride layer. In an alternative embodiment, the first layer is formed of silicon germanium (SiGe) and the second layer is formed of silicon (Si).

Figure 3:
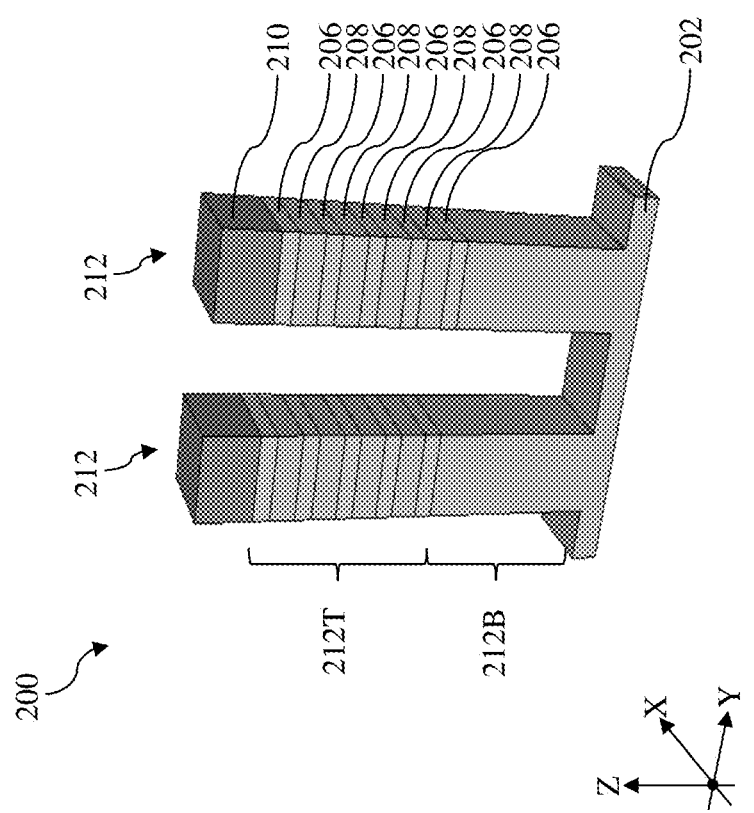
Figure 4:
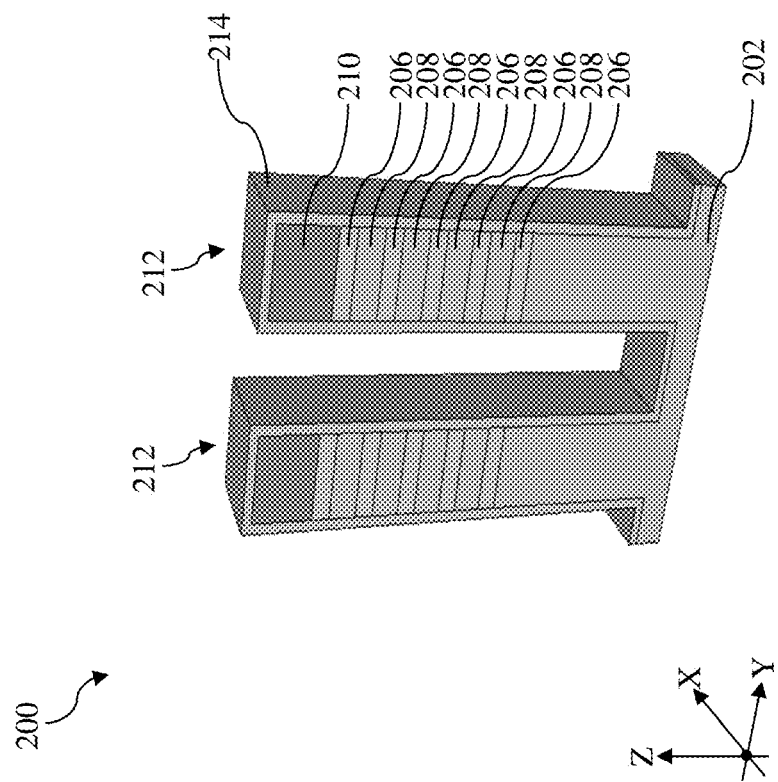

Referring to FIGS. 1A, 3 and 4, method 100 includes a block 106 where fin-shaped structure 212 are formed. In some embodiments, at block 104, the stack 204 and a portion of the substrate 202 are patterned to form the fin-shaped structures 212. As shown in FIG. 3, each of the fin-shaped structures 212 includes a base portion 212B formed from a portion of the substrate 202 and a top portion 212T formed from the stack 204. The top portion 212T is disposed over the base portion 212B. The fin-shaped structures 212 extend lengthwise along the X direction and extend vertically along the Z direction from the substrate 202. The fin-shaped structures 212 may be patterned using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the first hard mask layer 210 and then the patterned first hard mask layer 210 may be used to pattern the fin-shaped structures 212 by etching the stack 204 and the substrate 202. The etching process can include dry etching, wet etching, reactive ion etching (RIE), and/or other suitable processes.

In some embodiments, a semiconductor liner 214 may be deposited over the fin-shaped structure 212, as shown in FIG. 4. The semiconductor liner 214 may include silicon (Si) or silicon-rich silicon germanium (SiGe). In some implementations, the semiconductor liner 214 may be deposited using ALD, PEALD, VPE, MBE, or a suitable method. In some implementation where VPE or MBE are used, the process conditions are selected such that the deposition of the semiconductor liner 214 is not selective to surfaces of the stack 204 and the substrate 202. In these implementations, the semiconductor liner 214 is also deposited over top surfaces and sidewalls of the first hard mask layer 210. In some other implementations where the first hard mask layer 210 includes semiconductor materials, the process conditions for the VPE or MBE processes may be selected such that the deposition of the semiconductor liner 214 are selective to surface of semiconductor materials.

Figure 5:
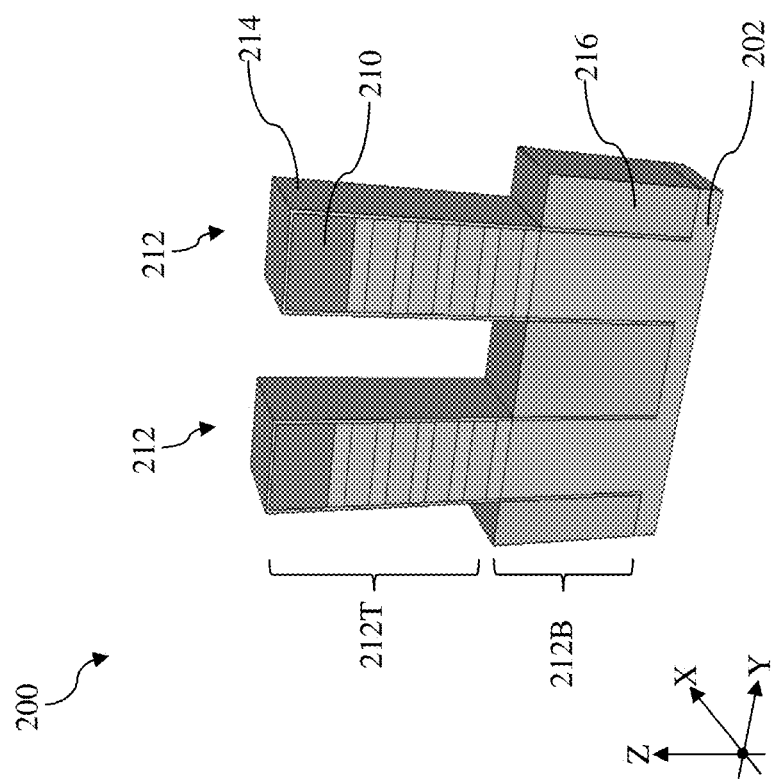

Referring to FIGS. 1A and 5, method 100 includes a block 108 where an isolation feature 216 is formed. After the fin-shaped structures 212 are formed, the isolation feature 216 shown in FIG. 5 is formed between neighboring fin-shaped structures 212. The isolation feature 216 may also be referred to as a shallow trench isolation (STI) feature 216. In an example process, a dielectric material for the isolation feature 216 is first deposited over the semiconductor liner 214 over the workpiece 200, filling the trenches between fin-shaped structures 212 with the dielectric material. In some embodiments, the dielectric material may include silicon oxide, silicon nitride, silicon oxynitride, fluorine-doped silicate glass (FSG), a low-k dielectric, combinations thereof, and/or other suitable materials. In various examples, the dielectric material may be deposited by a CVD process, a subatmospheric CVD (SACVD) process, a flowable CVD (FCVD) process, an ALD process, spin-on coating, and/or other suitable process. The deposited dielectric material is then thinned and planarized, for example by a chemical mechanical polishing (CMP) process, until at least a portion of the semiconductor liner 214 is exposed. The planarized dielectric material is further recessed by a dry etching process, a wet etching process, and/or a combination thereof to form the isolation feature 216. As shown in FIG. 5, the top portions 212T of the fin-shaped structures 212 rise above the isolation feature 216 while the base portions 212B are surrounded by the isolation feature 216.

Figure 6:
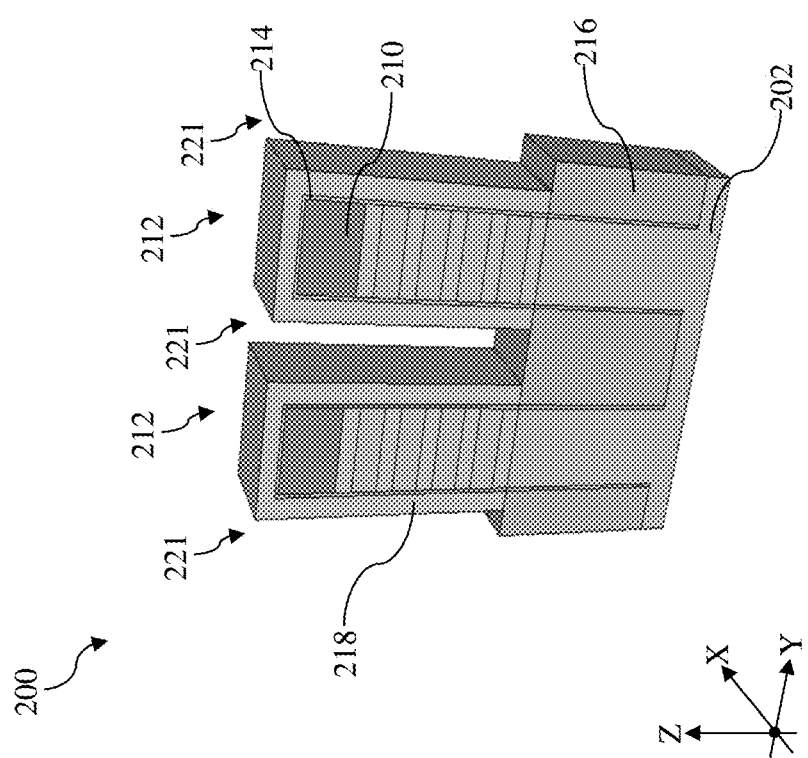

Referring to FIGS. 1A and 6, method 100 includes a block 110 where a cladding layer 218 is formed over the fin-shaped structures 212. In some embodiments, the cladding layer 218 may have a composition similar to that of the sacrificial layers 206. In one example, the cladding layer 218 may be formed of silicon germanium (SiGe). This common composition allows selective removal of the sacrificial layers 206 and the cladding layer 218 in a subsequent process. In some embodiments, the cladding layer 218 may be conformally and epitaxially grown using vapor phase epitaxy (VPE) or molecular bean epitaxy (MBE). As shown in FIG. 6, the cladding layer 218 is selectively disposed on exposed surfaces of the semiconductor liner 214. In some instances, the cladding layer 218 may have a thickness between about 5 nm and about 10 nm. After the deposition of the cladding layer 218, adjacent sidewalls of the cladding layer 218 may define a trench 221. A portion of the substrate 202 is exposed in the trench 221.

Figure 7:
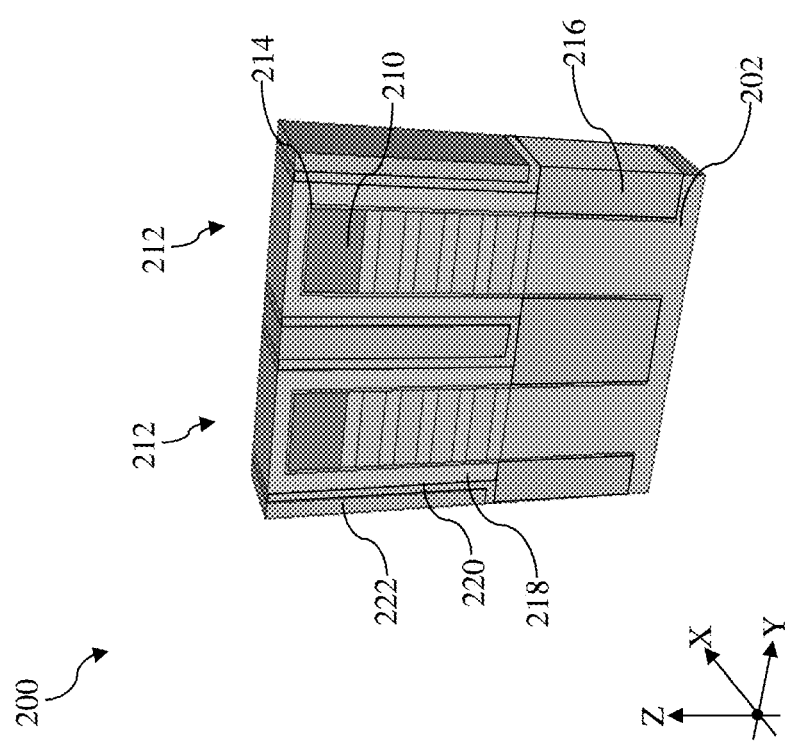
Figure 8:
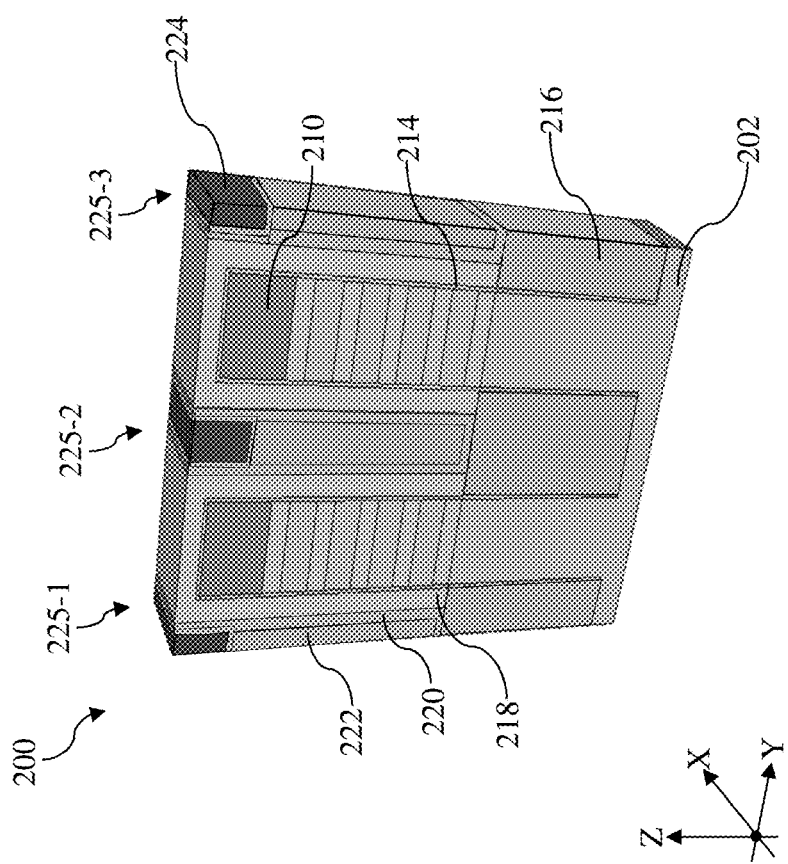

Referring to FIGS. 1A, 7 and 8, method 100 includes a block 112 where a first dielectric fin 225-1, a second dielectric fin 225-2, and a third dielectric fin 225-3 are formed. At block 112, the first dielectric fin 225-1, the second dielectric fin 225-2, and the third dielectric fin 225-3 are deposited into the trenches 221 (shown in FIG. 6). In the depicted embodiments, each of the first dielectric fin 225-1, the second dielectric fin 225-2, and the third dielectric fin 225-3 includes multiple layers. In an example process, a liner 220 is conformally deposited over the workpiece 200, including in the trenches 221, as shown in FIG. 7. The liner 220 may be deposited using PECVD, ALD, or a suitable method. The liner 220 lines the sidewalls and the bottom surfaces of the trenches 221. A filler layer 222 is then deposited over the liner 220 on the workpiece 200 using CVD, SACVD, FCVD, ALD, spin-on coating, and/or other suitable process. In some instances, a dielectric constant of the liner 220 is smaller than that of the filler layer 222. The liner 220 may include silicon, silicon nitride, silicon carbide, silicon carbonitride, silicon oxycarbonitride, aluminum oxide, aluminum nitride, aluminum oxynitride, zirconium oxide, zirconium nitride, zirconium aluminum oxide, hafnium oxide, or a suitable dielectric material. The filler layer 222 may include silicon oxide, silicon carbide, silicon oxynitride, silicon oxycarbonitride, or a suitable dielectric material. After the deposition of the liner 220 and the filler layer 222, the workpiece 200 is planarized using a planarization process, such as a chemical mechanical polishing (CMP) process, until portion of the liner 220 and the filler layer 222 over the cladding layer 218 are removed, as shown in FIG. 7. Referring to FIG. 8, after the planarization, the filler layer 222 is selectively and partially recessed to form a recess defined by the liner 220. A top liner 223 and a helmet layer 224 is then deposited over the workpiece 200. The top liner 223 may have a composition similar to that of the liner 220. The helmet layer 224 may include may include silicon nitride, silicon carbide, silicon carbonitride, silicon oxycarbonitride, aluminum oxide, aluminum nitride, aluminum oxynitride, zirconium oxide, zirconium nitride, zirconium aluminum oxide, hafnium oxide, or a suitable dielectric material. The workpiece 200 is then planarized using a CMP process to remove excess helmet layer 224 on the cladding layer 218. At this point, the first dielectric fin 225-1, the second dielectric fin 225-2, and the third dielectric fin 225-3 are substantially formed. Each of the first dielectric fin 225-1, the second dielectric fin 225-2, and the third dielectric fin 225-3 includes a helmet layer 224 disposed over a top liner 223 and the top liner 223 is disposed over a filler layer 222. The helmet layer 224, the top liner 223, and the filler layer 222 are spaced apart from the cladding layer 218 and the substrate 202 by the liner 220. In one embodiment, the liner 220 and the top liner 223 include silicon nitride, the filler layer 222 includes silicon oxide, and the helmet layer 224 includes aluminum oxide, aluminum nitride, aluminum oxynitride, zirconium oxide, zirconium nitride, zirconium aluminum oxide, or hafnium oxide.

Figure 9:
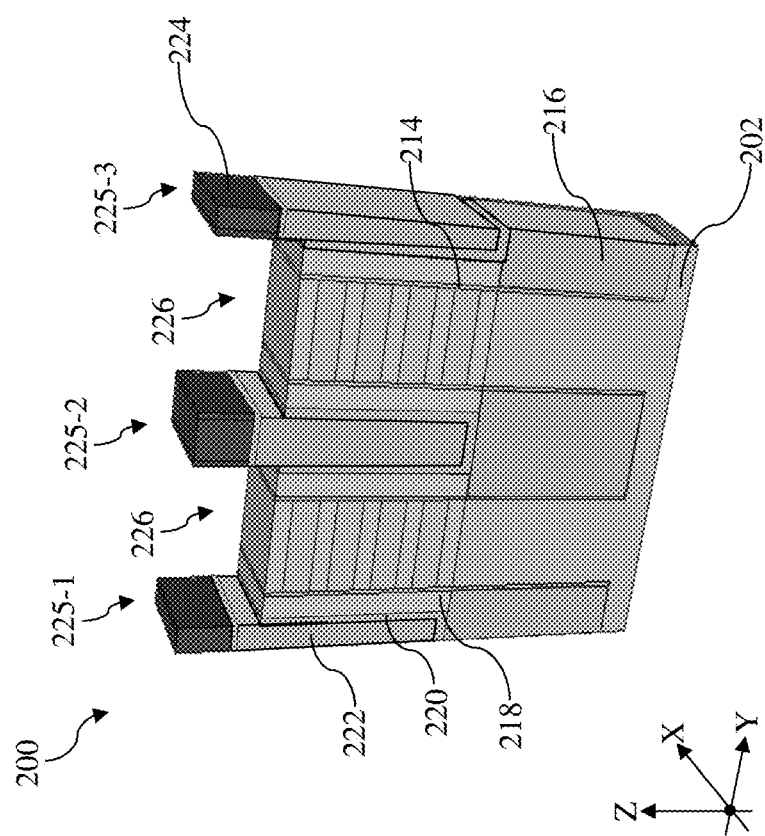

Referring to FIGS. 1A and 9, method 100 includes a block 114 where the first hard mask layer 210 are removed. In some embodiments, the workpiece 200 is anisotropically etched to selectively remove a portion of the cladding layer 218, a portion of the semiconductor liner 214, the first hard mask layer 210, a portion of the top liner 223, and a portion of the liner 220 to expose the topmost sacrificial layer 206, without substantially damaging the helmet layer 224. The anisotropic etch process at block 114 may include be a single stage etch process or a multi-stage etch process. When the anisotropic etch process is single-stage, it is selective to semiconductor materials (e.g. silicon and silicon germanium) and silicon nitride. When the anisotropic etch process is multi-stage, the first stage may be selective to semiconductor materials (e.g. silicon and silicon germanium) and the second stage may be selective to silicon nitride. In some implementations, the anisotropic etch process at block 114 may include hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

Figure 10:
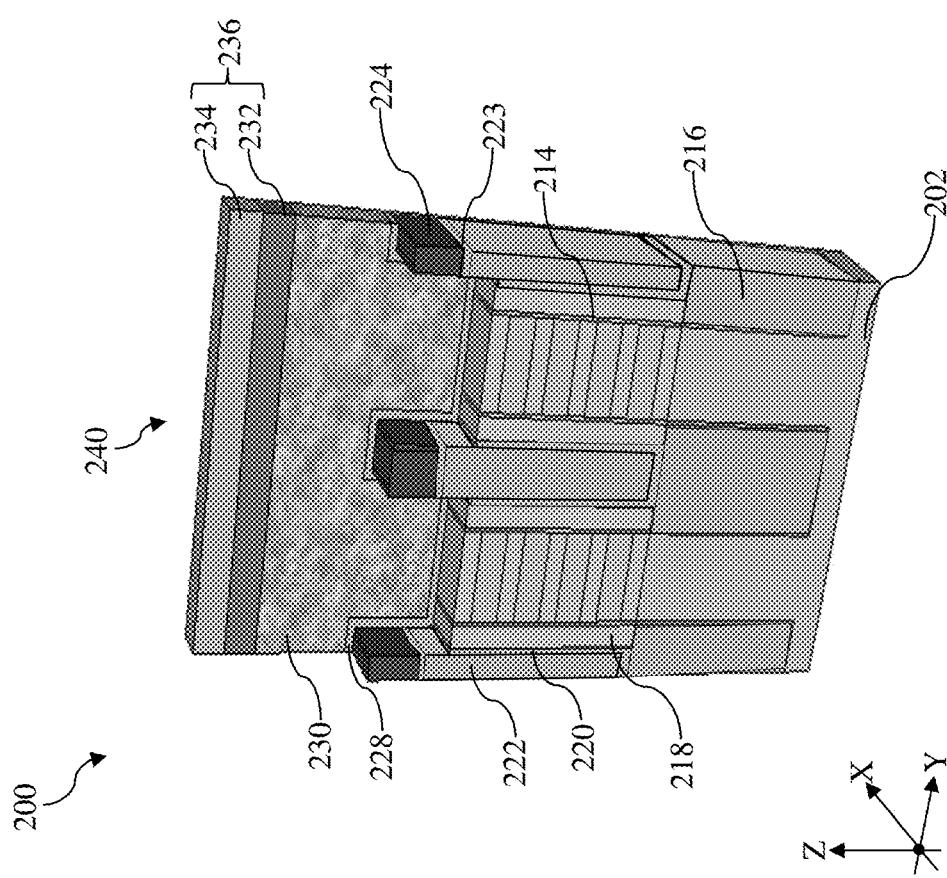

Referring to FIGS. 1A and 10, method 100 includes a block 116 where a dummy gate stack 240 are formed over the fin-shaped structures 212. In some embodiments, a gate replacement process (or gate-last process) is adopted where the dummy gate stack 240 serves as a placeholder for a functional gate structure. Other processes and configuration are possible. As shown in FIG. 10, the dummy gate stack 240 includes a dummy dielectric layer 228, a dummy electrode 230 disposed over the dummy dielectric layer 228. For patterning purposes, a gate top hard mask 236 is deposited over the dummy gate stack 240. The gate top hard mask 236 may be a multilayer and include a silicon nitride mask layer 232 and a silicon oxide mask 234 layer over the silicon nitride mask layer 232. The regions of the fin-shaped structures 212 underlying the dummy gate stack 240 may be referred to as channel regions. Each of the channel regions in a fin-shaped structure 212 is sandwiched between two source/drain regions for source/drain formation. In an example process, the dummy dielectric layer 228 is blanketly deposited over the workpiece 200 by CVD. A material layer for the dummy electrode 230 is then blanketly deposited over the dummy dielectric layer 228. The dummy dielectric layer 228 and the material layer for the dummy electrode 230 are then patterned using photolithography processes to form the dummy gate stack 240. In some embodiments, the dummy dielectric layer 228 may include silicon oxide and the dummy electrode 230 may include polycrystalline silicon (polysilicon).

Figure 11:
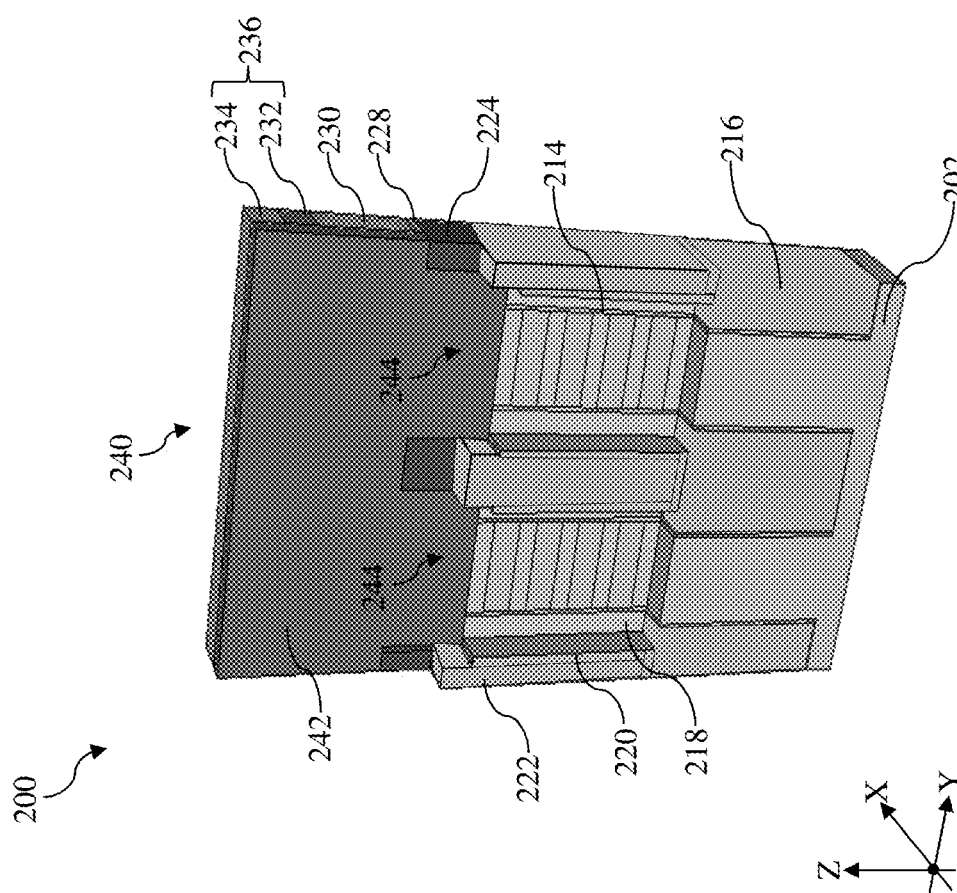

Referring to FIGS. 1A and 11, method 100 includes a block 118 where at least one gate spacer 242 is formed along sidewalls of the dummy gate stacks 240. The at least one gate spacer 242 may include two or more gate spacer layers. Dielectric materials for the at least one gate spacer 242 may be selected to allow selective removal of the dummy gate stack 240. Suitable dielectric materials may include silicon nitride, silicon oxycarbonitride, silicon carbonitride, silicon oxide, silicon oxycarbide, silicon carbide, silicon oxynitride, and/or combinations thereof. In an example process, the at least one gate spacer 242 may be conformally deposited over the workpiece 200 using CVD, subatmospheric CVD (SACVD), or ALD.

Referring to FIGS. 1A and 11, method 100 includes a block 120 where the source/drain regions of the fin-shaped structures 212 are recessed to form source/drain trenches 244. With the dummy gate stack 240 and the at least one gate spacer 242 serving as an etch mask, the workpiece 200 is anisotropically etched to form the source/drain trenches 244 over the source/drain regions of the fin-shaped structures 212. In some embodiments as illustrated in FIG. 11, operations at block 120 may substantially remove the top portions 212T of fin-shaped structures 212 in the source/drain regions. In some other alternative embodiments, the source/drain trenches 244 may extend into the base portions 212B, which is formed from the substrate 202. The anisotropic etch at block 120 may include a dry etch process or a suitable etch process. For example, the dry etch process may implement an oxygen-containing gas, hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. As shown in FIG. 11, the dry etch process at block 120 may etch the at least one gate spacer 242 and the liner 220 at a slower rate and leave them behind on sidewalls of the filler layer 222 and the dummy gate stack 240. Sidewalls of the plurality of channel layers 208, the plurality of the sacrificial layers 206, and the cladding layer 218 are exposed in the source/drain trenches 244.

Figure 12:
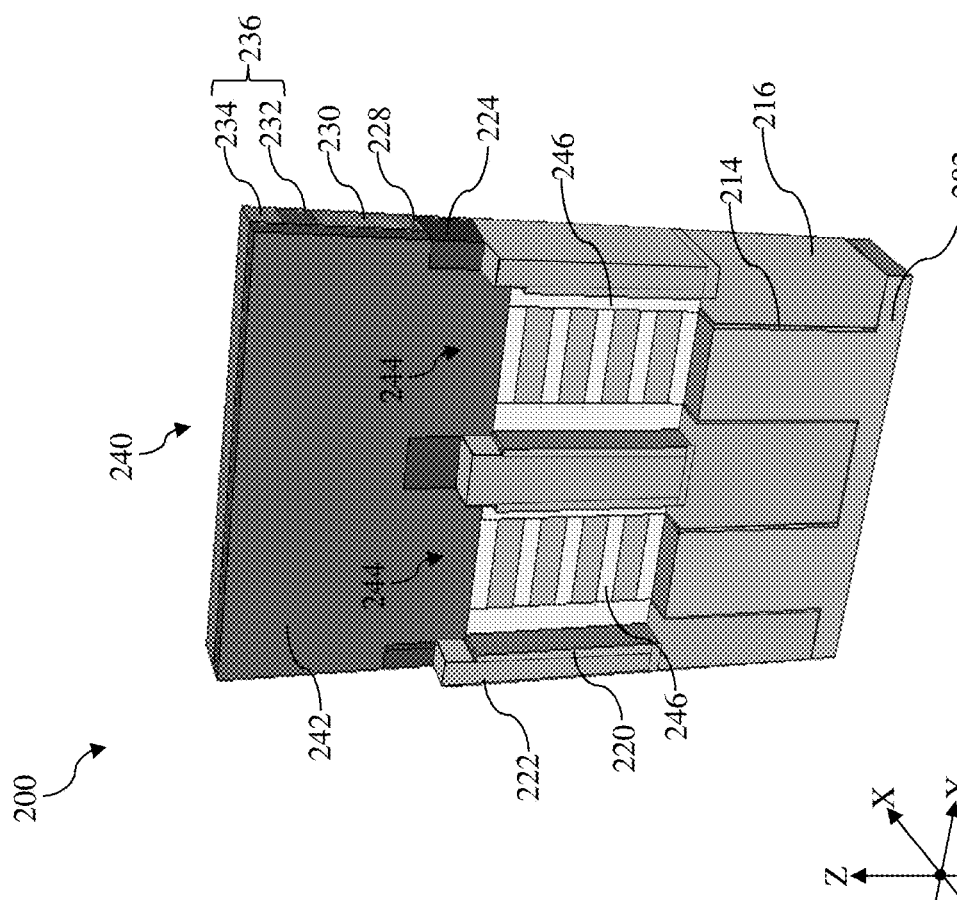

Referring to FIGS. 1A, 11 and 12, method 100 includes a block 122 where inner spacer features 246 are formed. Referring to FIG. 11, at block 122, the sacrificial layers 206 exposed in the source/drain trenches 244 are first selectively and partially recessed to form inner spacer recesses, while the exposed channel layers 208 are substantially unetched. Because the cladding layer 218 and the sacrificial layers 206 share a similar composition, the cladding layer 218 may be etched at block 122. In an embodiment where the channel layers 208 consist essentially of silicon (Si), sacrificial layers 206 consist essentially of silicon germanium (SiGe), and the cladding layer 218 consists essentially of silicon germanium (SiGe), the selective and partial recess of the sacrificial layers 206 and the cladding layer 218 may include a SiGe oxidation process followed by a SiGe oxide removal. In that embodiments, the SiGe oxidation process may include use of ozone. In some other embodiments, the selective recess may include a selective isotropic etching process (e.g., a selective dry etching process or a selective wet etching process), and the extent at which the sacrificial layers 206 and the cladding layer 218 are recessed is controlled by duration of the etching process. The selective dry etching process may include use of one or more fluorine-based etchants, such as fluorine gas or hydrofluorocarbons. The selective wet etching process may include APM etch (e.g., ammonia hydroxide-hydrogen peroxide-water mixture). After the formation of the inner spacer recesses, an inner spacer material layer is then conformally deposited using CVD or ALD over the workpiece 200, including over and into the inner spacer recesses and the space left behind by the removed portion of the cladding layer 218. The inner spacer material may include silicon nitride, silicon oxycarbonitride, silicon carbonitride, silicon oxide, silicon oxycarbide, silicon carbide, or silicon oxynitride. After the deposition of the inner spacer material layer, the inner spacer material layer is etched back to form inner spacer features 246, as illustrated in FIG. 12.

Figure 13:
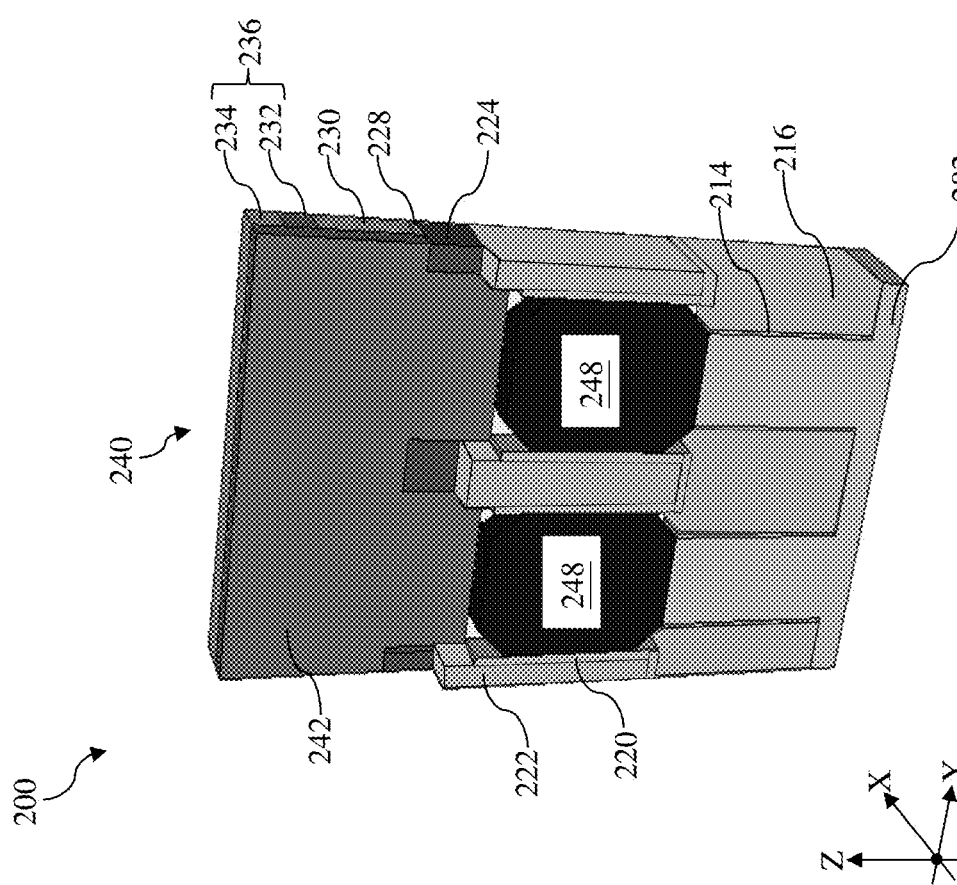

Referring to FIGS. 1A and 13, method 100 includes a block 124 where source/drain features 248 are formed in the source/drain trenches 244. The source/drain features 248 are selectively and epitaxially deposited on the exposed semiconductor surfaces of the channel layers 208 and the substrate 202. The source/drain features 248 may be deposited using an epitaxial process, such as vapor-phase epitaxy (VPE), ultra-high vacuum CVD (UHV-CVD), molecular beam epitaxy (MBE), and/or other suitable processes. The source/drain features 248 may be either n-type or p-type. When the source/drain features 248 are n-type, it may include silicon (Si) and may be doped with an n-type dopant, such as phosphorus (P) or arsenic (As). When the source/drain features 248 are p-type, it may include silicon germanium (SiGe) or germanium (Ge) and may be doped with a p-type dopant, such as boron (B) or gallium (Ga). Doping of the source/drain features 248 may be performed either in situ with their deposition or ex situ using an implantation process, such as a junction implant process. While not explicitly shown in the figures, the source/drain features 248 may include a first epitaxial layer and a second epitaxial layer disposed on the first epitaxial layer. In some instances, the first epitaxial layer and the second epitaxial layer may be doped with the same dopant species. In some alternative implementations, the first epitaxial layer and the second epitaxial layer may be doped with different dopant species. The second epitaxial layer may include a greater doping concentration than the first epitaxial layer to lower contact resistance. While the source/drain features 248 are not epitaxially grown from surfaces of the inner spacer features 246 and the liner 220, overgrowth of the source/drain features 248 may cover and come in contact with surfaces of the inner spacer features 246 and the liner 220. The source/drain features 248 are disposed in source/drain regions adjacent the channel region below the dummy gate stack 240.

Figure 14:
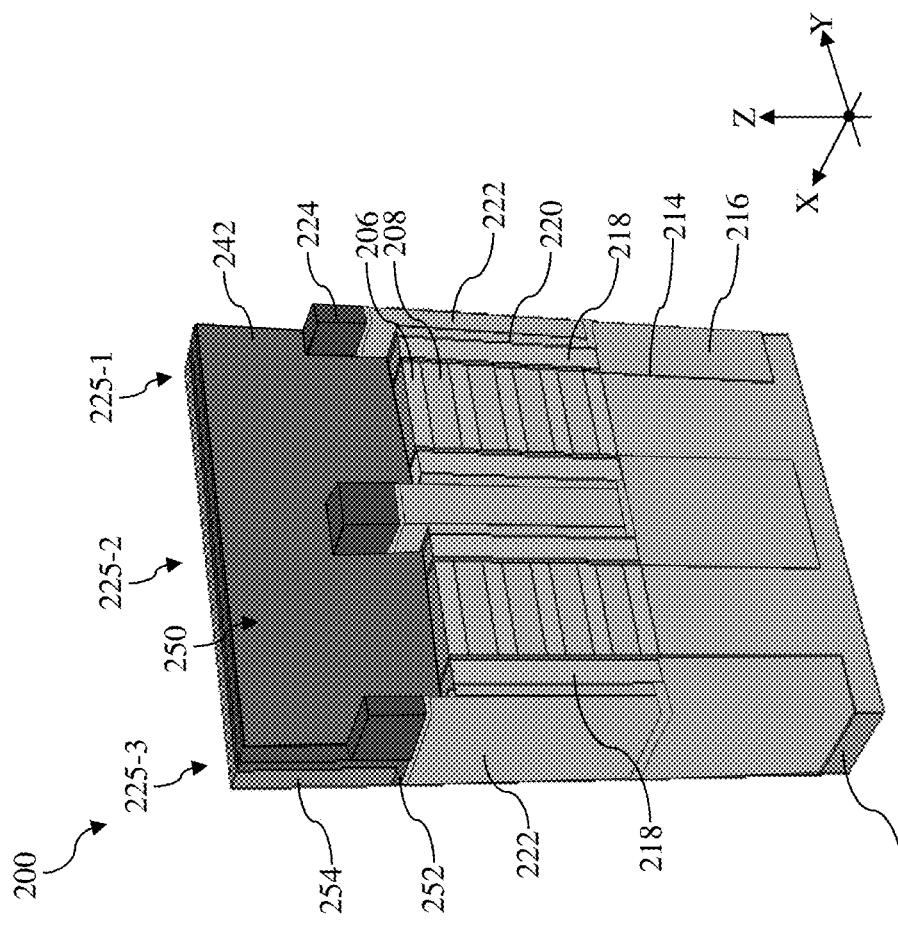

Referring to FIGS. 1A and 14, method 100 includes a block 126 where a contact etch stop layer (CESL) 252 and an interlayer dielectric (ILD) layer 254 are deposited. In an example process, the CESL 252 is first conformally deposited over the workpiece 200 and then the ILD layer 254 is blanketly deposited over the CESL 252. The CESL 252 may include silicon nitride, silicon oxide, silicon oxynitride, and/or other materials known in the art. The CESL 252 may be deposited using ALD, plasma-enhanced chemical vapor deposition (PECVD) process and/or other suitable deposition or oxidation processes. In some embodiments, the ILD layer 254 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 254 may be deposited by spin-on coating, an FCVD process, or other suitable deposition technique. In some embodiments, after formation of the ILD layer 254, the workpiece 200 may be annealed to improve integrity of the ILD layer 254. To remove excess materials and to expose top surfaces of the dummy electrode 230 of the dummy gate stacks 240, a planarization process (such a chemical mechanical polishing (CMP) process) may be performed to the workpiece 200 to provide a planar top surface. Top surfaces of the dummy electrodes 230 are exposed on the planar top surface.

Referring to FIGS. 1A and 14, method 100 includes a block 128 where the dummy gate stack 240 are removed. At block 128, the dummy gate stack 240 exposed at the conclusion of block 126 is removed from the workpiece 200 by a selective etch process, as shown in FIG. 14. The selective etch process may be a selective wet etch process, a selective dry etch process, or a combination thereof. In the depicted embodiments, the selective etch process selectively removes the dummy dielectric layer 228 and the dummy electrode 230 without substantially damaging the helmet layer 224 and the filler layer. The removal of the dummy gate stack 240 results in a gate trenche 250 over the channel regions.

Figure 15:
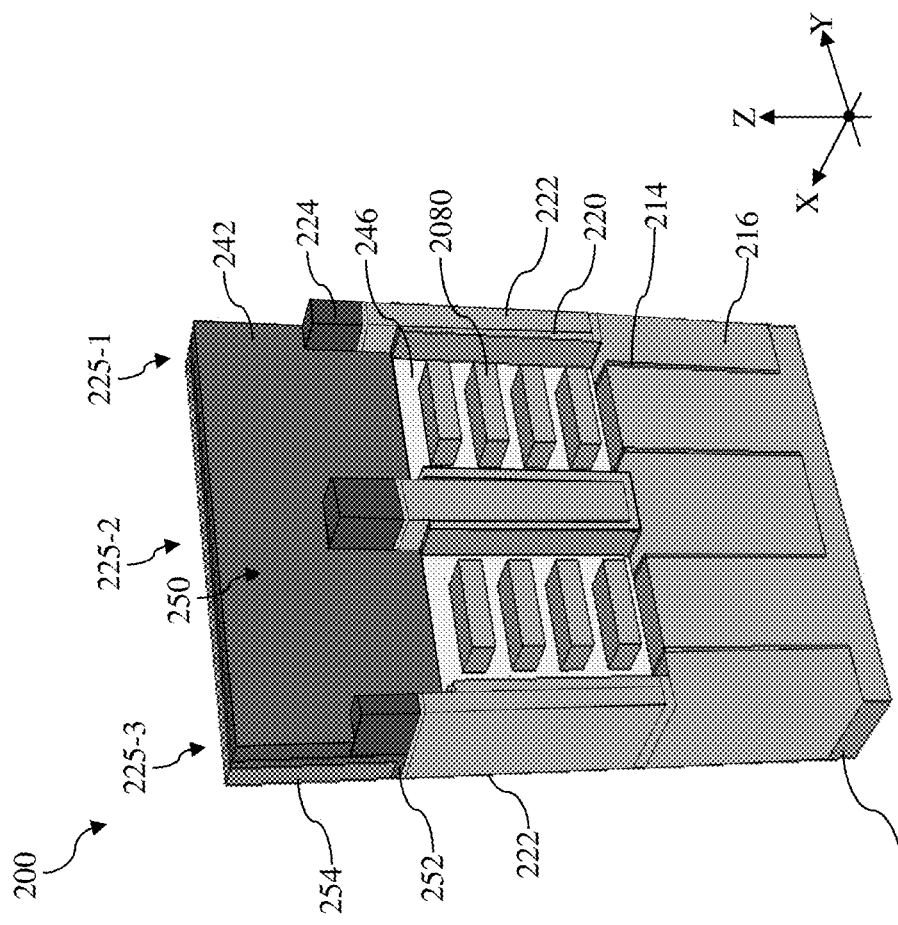

Referring to FIGS. 1A and 15, method 100 includes a block 130 where the sacrificial layers 206 in the channel region are removed to release channel members 2080. After the removal of the dummy gate stack 240, channel layers 208, sacrificial layers 206, and the cladding layer 218 in the channel region are exposed in the gate trenches 250. Due to their similar composition, the exposed sacrificial layers 206 between the channel layers 208 and the cladding layer 218 may be selectively removed to release the channel layers 208 to form channel members 2080, shown in FIG. 15. The channel members 2080 are vertically stacked along the Z direction. The selective removal of the sacrificial layers 206 and the cladding layer 218 may be implemented by selective dry etch, selective wet etch, or other selective etch processes. In some embodiments, the selective wet etching includes an APM etch (e.g., ammonia hydroxide-hydrogen peroxide-water mixture). In some alternative embodiments, the selective removal includes silicon germanium oxidation followed by a silicon germanium oxide removal. For example, the oxidation may be provided by ozone clean and then silicon germanium oxide removed by an etchant such as $NH_4OH$. With the removal of the sacrificial layers 206 and the cladding layer 218 in the channel region, the liner 220, the channel members 2080, the top surface of the base portion 212B, the semiconductor liner 214, and the isolation feature 216 are exposed in the gate trench 250.

Figure 16:
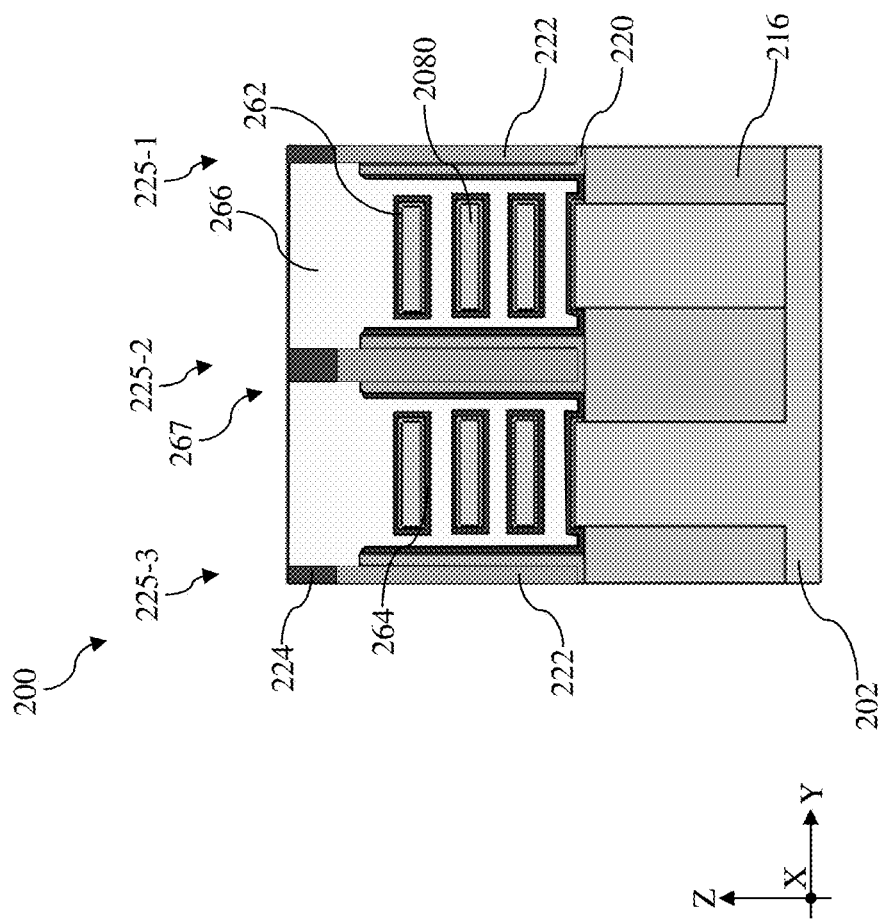

Referring to FIGS. 1B and 16, method 100 includes a block 132 where gate structure layers wrap around each of the channel members 2080. The gate structure layers may include an interfacial layer 262 on the channel members 2080 and the substrate 202, a gate dielectric layer 264 over the interfacial layer 262, and a gate electrode layer 266 over the gate dielectric layer 264. In some embodiments, the interfacial layer 262 includes silicon oxide and may be formed as result of a pre-clean process. An example pre-clean process may include use of RCA SC-1 (ammonia, hydrogen peroxide and water) and/or RCA SC-2 (hydrochloric acid, hydrogen peroxide and water). The pre-clean process oxidizes the exposed surfaces of the channel members 2080 and the substrate 202 to form the interfacial layer 262. The gate dielectric layer 264 is then deposited over the interfacial layer 262 using ALD, CVD, and/or other suitable methods. The gate dielectric layer 264 may include high-K dielectric materials. As used herein, high-k dielectric materials include dielectric materials having a high dielectric constant, for example, greater than that of thermal silicon oxide (~3.9). In one embodiment, the gate dielectric layer 264 may include hafnium oxide. Alternatively, the gate dielectric layer 264 may include other high-K dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr)TiO$_3$ (BST), silicon nitride (SiN), silicon oxynitride (SiON), combinations thereof, or other suitable material. After the formation or deposition of the interfacial layer 262 and the gate dielectric layer 264, a gate electrode layer 266 is deposited over the gate dielectric layer 264. The gate electrode layer 266 may be a multilayer structure that includes at least one work function layer and a metal fill layer. By way of example, the at least one work function layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), or tantalum carbide (TaC). The metal fill layer may include aluminum (Al), tungsten (W), nickel (Ni), titanium (Ti), ruthenium (Ru), cobalt (Co), platinum (Pt), tantalum silicon nitride (TaSiN), copper (Cu), other refractory metals, or other suitable metal materials or a combination thereof. In various embodiments, the gate electrode layer 266 may be formed by ALD, PVD, CVD, e-beam evaporation, or other suitable process. In various embodiments, a planarization process, such as a CMP process, may be performed to remove excessive materials to provide a substantially planar top surface of the gate structures. Referring to FIG. 16, the deposited gate structure layers wrap around each of the channel members 2080 and are divided by the first dielectric fin 225-1, the second dielectric fin 225-2 and the third dielectric fin 225-3.

Figure 17:
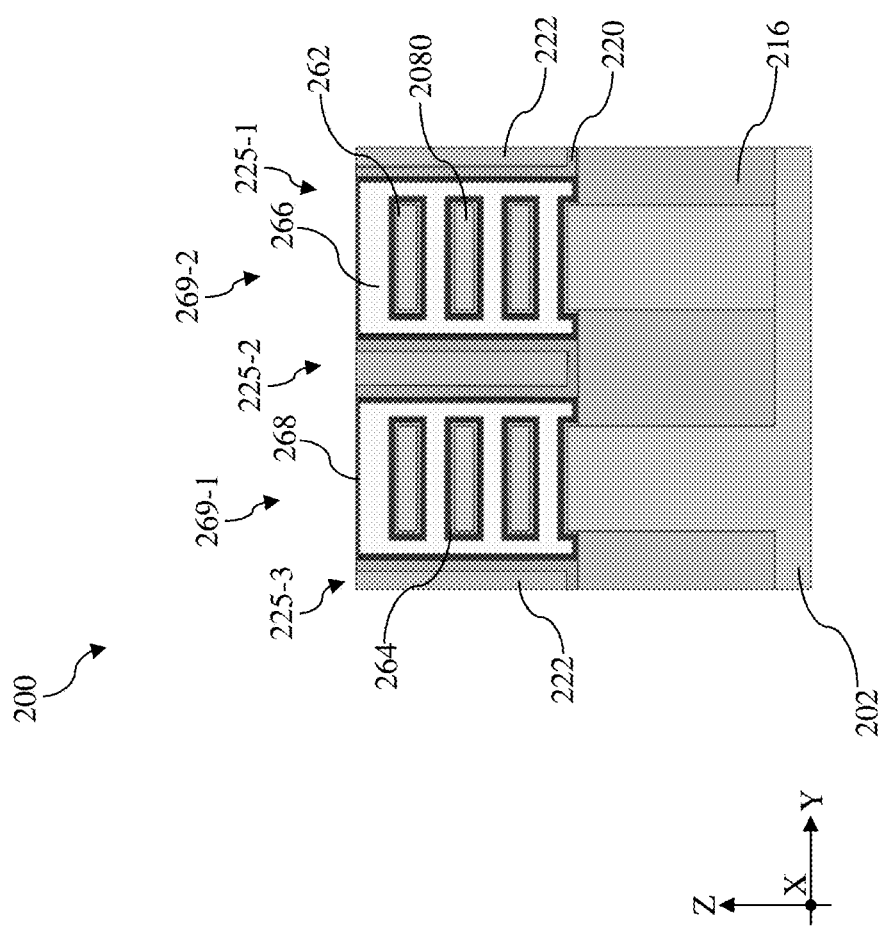

Referring to FIGS. 1B and 17, method 100 includes a block 134 where the workpiece 200 is planarized to form a first gate structure 269-1 and a second gate structure 269-2 divided by the second dielectric fin 225-2. As shown in FIG. 17, at block 134, the portion of the gate electrode layer 266 that is above the first dielectric fin 225-1, the second dielectric fin 225-2 and the third dielectric fin 225-3 is removed such that the first gate structure 269-1 is disposed between the third dielectric fin 225-3 and the second dielectric fin 225-2 and the second gate structure 269-2 is disposed between the second dielectric fin 225-2 and the first dielectric fin 225-1. It is noted that the helmet layer 224, the top liner 223, and a portion of the filler layer 222 in the first dielectric fin 225-1, the second dielectric fin 225-2 and the third dielectric fins 225-3 are also removed at block 134. The first gate structure 269-1 and the second gate structure 269-2 are divided by the second dielectric fin 225-2. The planarization at block 134 may performed using a CMP process. Each of the first gate structure 269-1 and the second gate structure 269-2 wraps around channel members 2080 formed from one of the fin-shaped structures 212.

Referring to FIGS. 1B and 17, method 100 includes a block 136 where a first metal layer 268 is selectively deposited on the first gate structure 269-1 and the second gate structure 269-2. At block 136, the first metal layer 268 is selectively deposited on the exposed gate electrode layer of the first gate structure 269-1 and the second gate structure 269-2, but not on surfaces of the first dielectric fin 225-1, the second dielectric fin 225-2 and the third dielectric fin 225-3. As a result, the first metal layer 268 includes two separate portions, one disposed over the first gate structure 269-1 and the other disposed over the second gate structure 269-2. In some embodiments, the first metal layer 268 may be deposited using metal organic chemical vapor deposition (MOCVD) using metal organic precursors, such as tetrakis (ethylmethylamido)titanium (TEMAT) or other precursors that include metal atoms and organic ligands. In some implementations, the first metal layer 268 may include titanium, titanium nitride, tantalum nitride, tungsten, ruthenium, aluminum, cobalt, or nickel. The first metal layer 268 may be formed to a thickness between about 2 nm and about 20 nm. As will be described below, the first metal layer 268 serves as a metal hard mask layer working in conjunction with the second hard mask layer 270. In some alternative embodiments where the second hard mask layer 270 is sufficiently etch resistant, the first metal layer 268 may be omitted.

Figure 18:
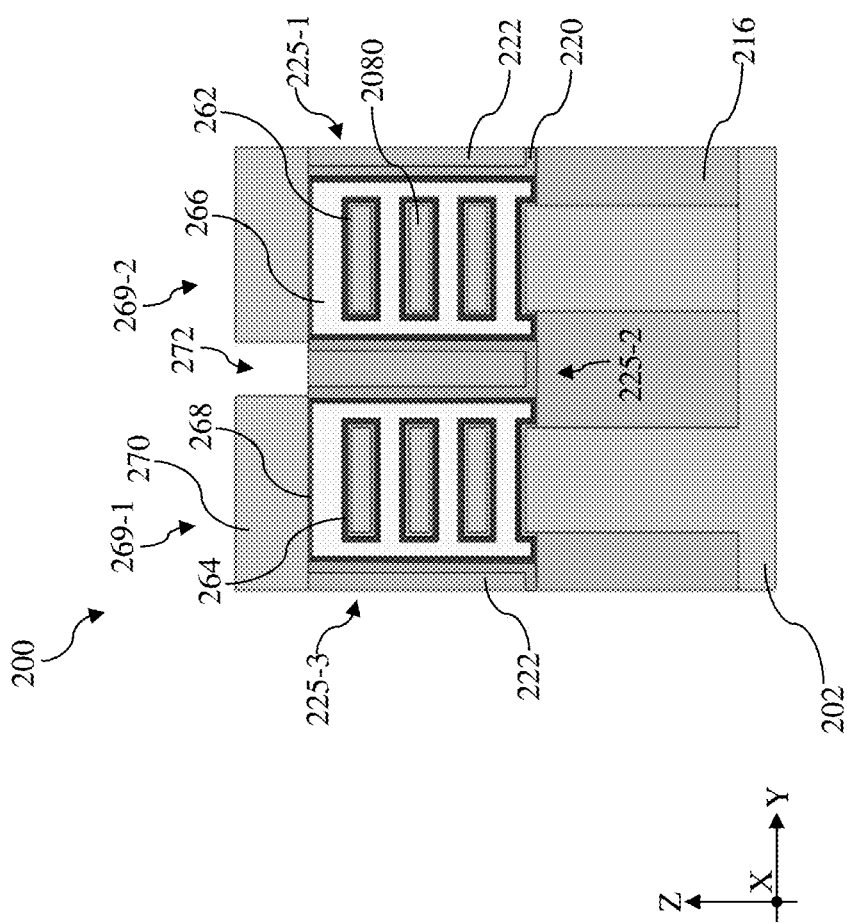
Figure 19:
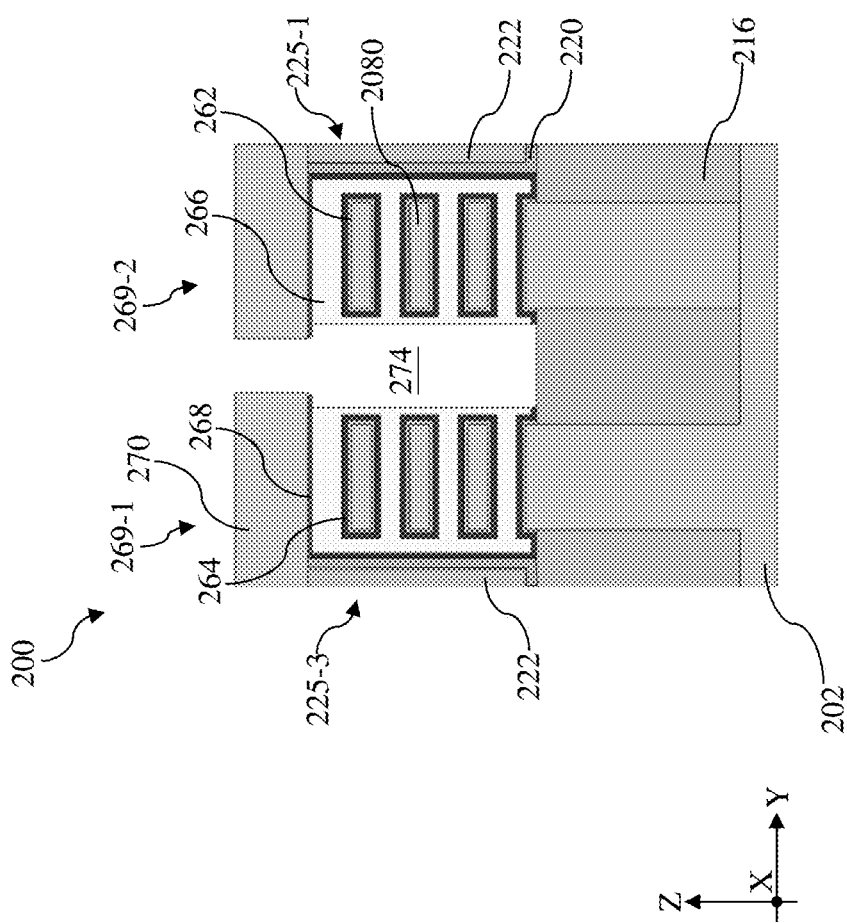

Referring to FIGS. 1B, 18 and 19, method 100 includes a block 138 where the second dielectric fin 225-2 is selectively removed to form an isolation trench 274 by use of a second hard mask layer 270. Photolithography techniques are used in selectively removing the second dielectric fin 225-2. In an example process, a second hard mask layer 270 is blanketly deposited over the workpiece 200, including over the first dielectric fin 225-1, the second dielectric fin 225-2, the third dielectric fin 225-3, and the first metal layer 268. In some implementations, the second hard mask layer 270 may be deposited using CVD, PECVD, or a suitable deposition process. The second hard mask layer 270 may include silicon oxide, silicon nitride, silicon carbide, silicon carbonitride, silicon oxynitride, silicon oxycarbonitride, aluminum oxide, aluminum nitride, aluminum oxynitride, zirconium oxide, zirconium nitride, zirconium aluminum oxide, hafnium oxide, or a suitable dielectric material. the second hard mask layer 270 is patterned to form an opening 272 to expose the second dielectric fin 225-2. A photoresist layer is blanketly deposited over the second hard mask layer 270 using FCVD or spin-on coating and patterned using photolithography processes. The patterned photoresist layer is applied as an etch mask when etching the second hard mask layer 270 to form the opening 272, as shown in FIG. 18.

Reference is now made to FIG. 19. With the second dielectric fin 225-2 exposed in the opening 272, the workpiece 200 is subject to an isotropic etch process to form the isolation trench 274. An example isotropic etch process at block 138 may be a wet etch process that is selective to dielectric materials and etches metal at a slower rate. An example wet etch process may include hydrofluoric acid, diluted hydrofluoric acid (DHF). As shown in FIG. 19, the isotropic and selective etch at block 138 not only removes the second dielectric fin 225-2 but also the gate dielectric layer 264 exposed in the isolation trench 274. That is, sidewalls of the first gate structure 269-1 and second gate structure 269-2 are exposed in the isolation trench 274. In some implementations, the selective wet etch process at block 138 is allowed to undercut the first metal layer 268. In these implementations, a portion of the isolation trench 274 below the first metal layer 268 is wider along the Y direction than a portion of the isolation trench 274 above the first metal layer 268. In other words, the first meta layer 268 overhangs the first gate structure 269-1 and the second gate structure 269-2. When the first metal layer 268 is not formed at block 136, the selective wet etch at block 138 may undercut the second hard mask layer 270.

Figure 20:
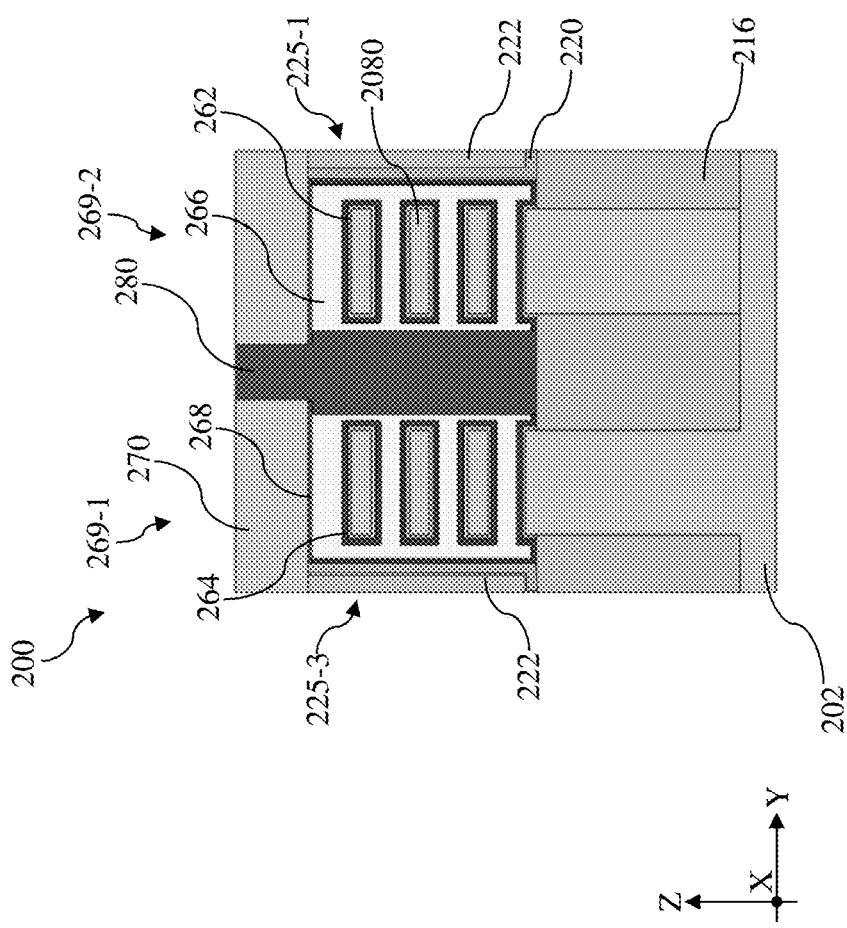

Referring to FIGS. 1B and 20, method 100 includes a block 140 where an isolation structure 280 is formed in the isolation trench 274. In some embodiments, a dielectric material for the isolation structure 280 is deposited into the isolation trench 274 using a deposition technique that has good hole-filling ability. In some instances, the dielectric material for the isolation structure 280 is deposited using ALD or PEALD. After the deposition of the dielectric material for the isolation structure 280, a planarization process, such as a CMP process, is performed to remove the excess material from over the second hard mask layer 270. The isolation structure 280 may include silicon oxide, silicon nitride, silicon carbide, silicon carbonitride, silicon oxynitride, silicon oxycarbonitride, aluminum oxide, aluminum nitride, aluminum oxynitride, zirconium oxide, zirconium nitride, zirconium aluminum oxide, hafnium oxide, or a suitable dielectric material. The shape and profile of the isolation structure 280 track those of the isolation trench 274.

Figure 21:
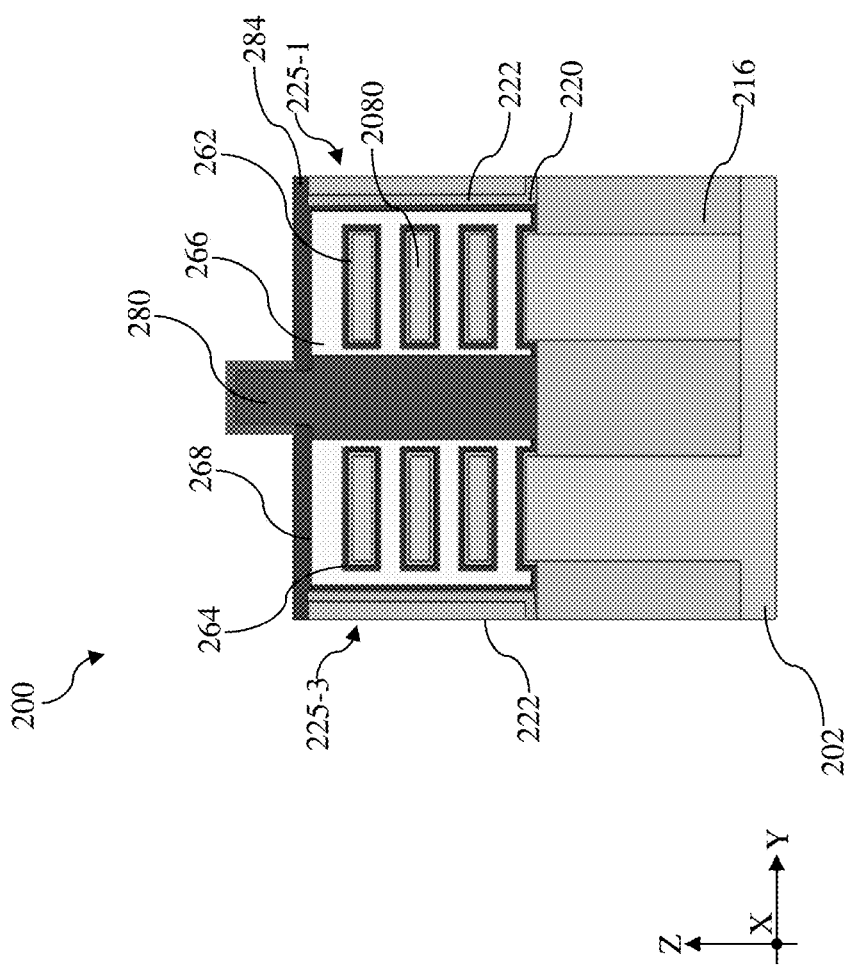

Referring to FIGS. 1B and 21, method 100 includes a block 142 where the second hard mask layer 270 is selectively removed. In some embodiments, because a composition of the second hard mask layer 270 is different from that of the isolation structure 280, the second hard mask layer 270 may be selectively removed without substantially damaging the isolation structure 280. In one embodiment, the second hard mask layer 270 is formed of silicon nitride and the isolation structure 280 is formed of silicon oxide. In this embodiment, the selective removal of the second hard mask layer 270 may be performed using an etch process selective to silicon nitride. After the selective removal of the second hard mask layer 270, a portion of the isolation structure 280 rises above the first metal layer 268.

Figure 22:
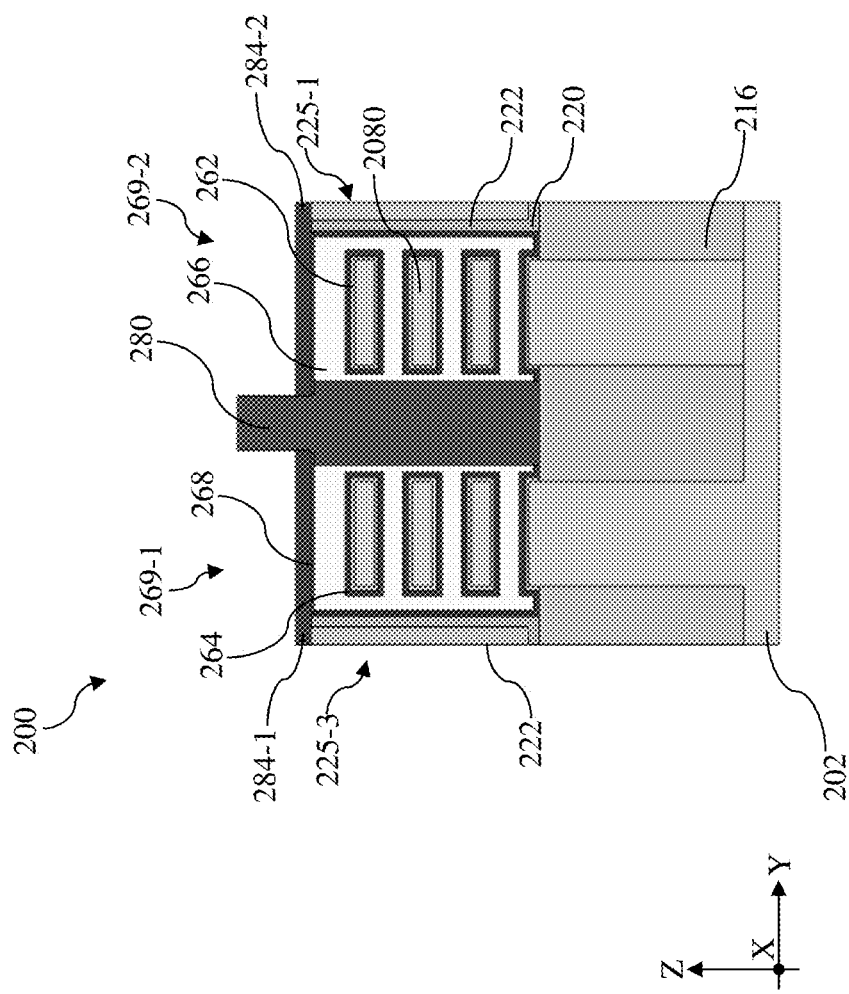

Referring to FIGS. 1B, 21, 22, and 24-27, method 100 includes a block 144 where a second metal layer 284 is formed over the first metal layer 268. The present disclosure provides more than one example process to form the second metal layer 284. Reference is first made to FIGS. 21 and 22. In some embodiments, the second metal layer 284 is deposited over the workpiece 200 using physical vapor deposition (PVD) or a suitable deposition method, as shown in FIG. 21. After the second metal layer 284 is deposited, the second metal layer 284 is etched back until the isolation structure 280 separate the second metal layer 284 into a first segment 284-1 over the first gate structure 269-1 and a second segment 284-2 over the second gate structure 269-2. That is, the portion of the second metal layer 284 that is disposed on sidewalls and the top surface of the isolation structure 280 is removed to physically and electrically isolate the first segment 284-1 and the second segment 284-2. In some embodiments represented in FIG. 24, the etch back of the second metal layer 284 leaves behind corner portions 2840, where a portion of the first segment 284-1 and a portion of the second segment 284-2 extend vertically along sidewalls of the isolation structure 280. When the corner portions 2840 are present, they may have a height between about 1 nm and about 3 nm. The second metal layer 284 may include titanium, titanium nitride, tantalum nitride, tungsten, ruthenium, aluminum, cobalt, or nickel. The first segment 284-1 and the second segment 284-2 may have a thickness between about 2 nm and about 20 nm. As shown in FIG. 22, unlike the first metal layer 268, the first segment 284-1 extends over the third dielectric fin 225-3 and the second segment 284-2 extend over the first dielectric fin 225-1. The first segment 284-1 comes in direct contact with the third dielectric fin 225-3 and the second segment 284-2 is in contact with the first dielectric fin 225-1. While not explicitly shown, each of the first segment 284-1 and the second segment 284-2 may further extend over an adjacent gate structure and serve as a local interconnect.

Figure 25:
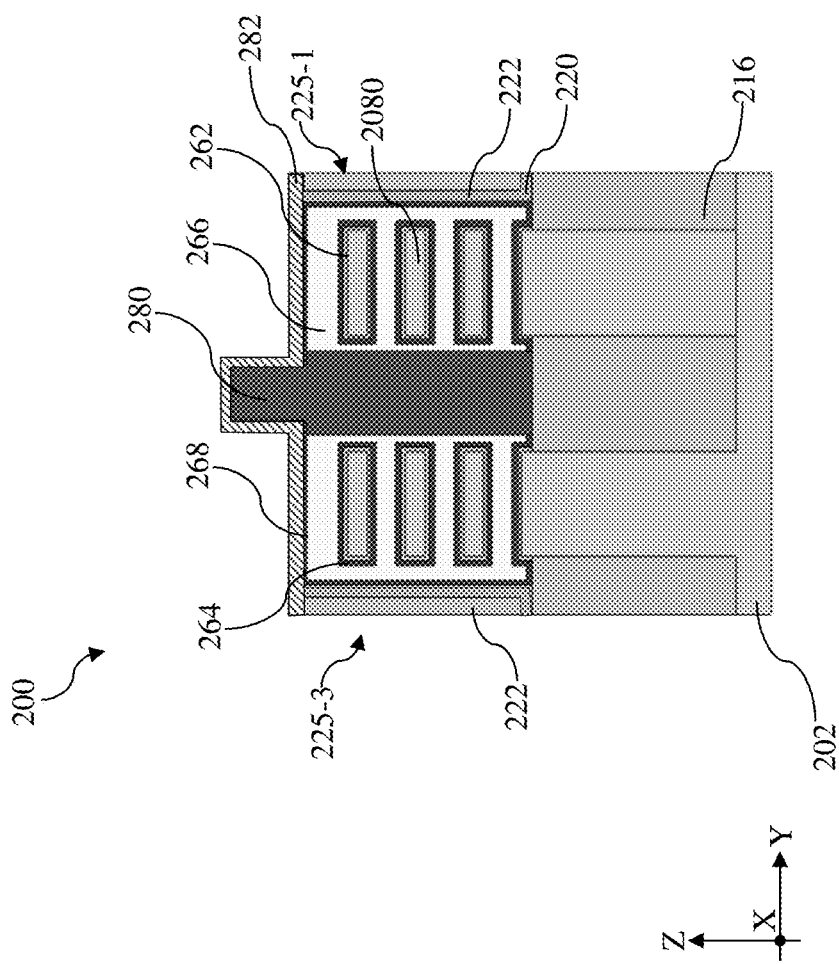
Figure 26:
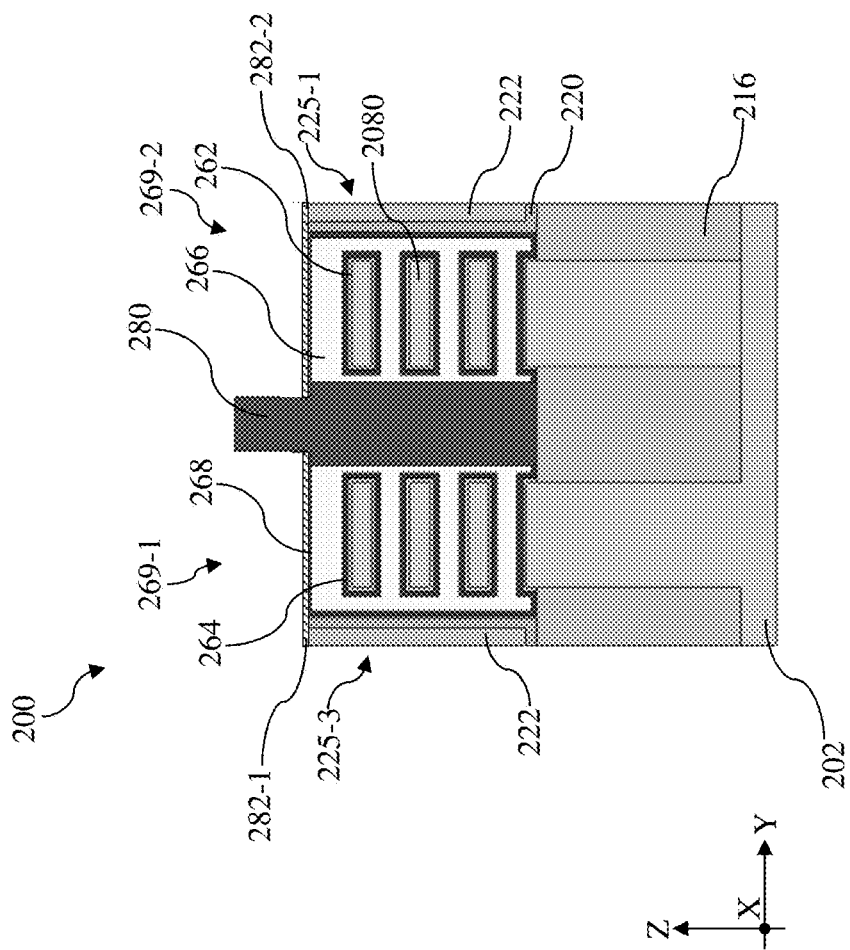
Figure 27:
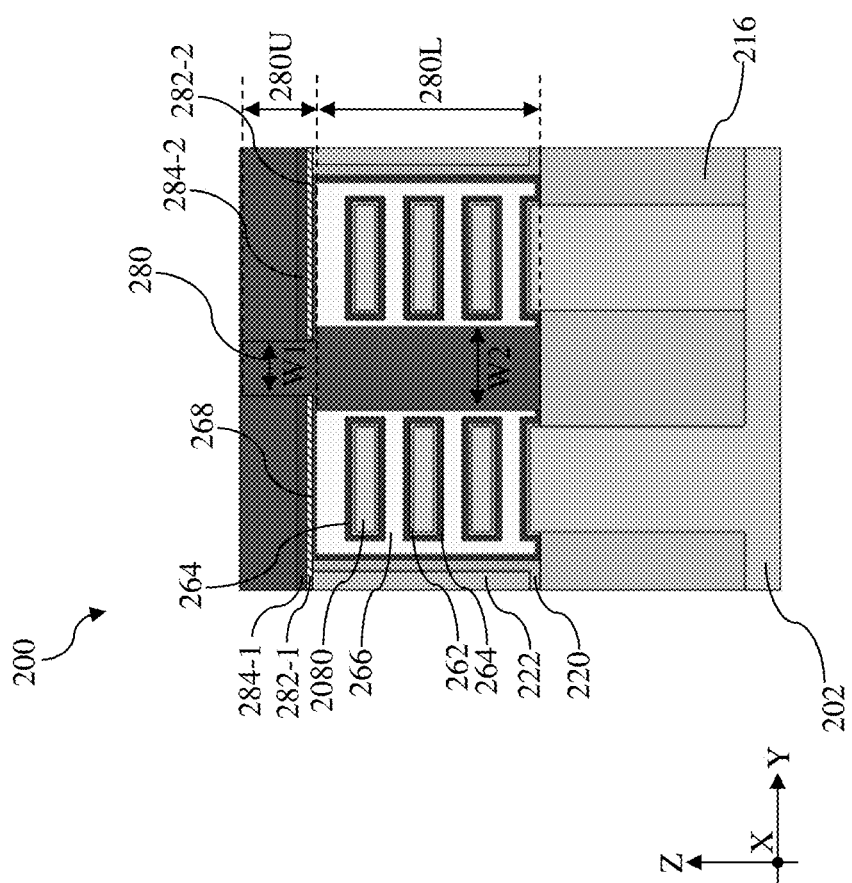

Reference is then made to FIGS. 25, 26 and 27. In some alternative embodiments, the formation of the second metal layer 284 includes use of a seed layer 282. Referring to FIG. 25, after the selective removal of the second hard mask layer 270, a seed layer 282 is blanketly deposited over the workpiece 200, including on the first metal layer 268 and the isolation structure 280. The seed layer 282 may include titanium, titanium nitride, tantalum nitride, tungsten, ruthenium, aluminum, cobalt, or nickel and may have a thickness between about 1 nm and about 5 nm. Referring to FIG. 26, an etch back is performed to physically and electrically sever the seed layer 282 into a first portion 282-1 over the first gate structure 269-1 and a second portion 282-2 over the second gate structure 269-2. After the etch back process, the first portion 282-1 and the second portion 282-2 are separated by the isolation structure 280. Referring then to FIG. 27, the first segment 284-1 and the second segment 284-2 are selectively deposited on the first portion 282-1 and the second portion 282-2, respectively. In some embodiments, the first segment 284-1 and the second segment 284-2 of the second metal layer 284 may be deposited using MOCVD or electroless plating. Because the first portion 282-1 and the second portion 282-2 are already separated and the deposition is selective, formation of the first segment 284-1 and the second segment 284-2 does not require an etch back process of the second metal layer 284. That is, the first portion 282-1 and the second portion 282-2 of the seed layer 282 allows self-aligned deposition of the second metal layer 284.

Referring to FIGS. 1B, 23, 24, and 27, method 100 includes a block 146 where a gate self-aligned contact (SAC) dielectric layer 288 is formed over the second metal layer 284. In some embodiments, the gate SAC dielectric layer 288 includes silicon oxide, silicon nitride, silicon carbide, silicon carbonitride, silicon oxynitride, silicon oxycarbonitride, aluminum oxide, aluminum nitride, aluminum oxynitride, zirconium oxide, zirconium nitride, zirconium aluminum oxide, hafnium oxide, or a suitable dielectric material. The gate SAC dielectric layer 288 may be deposited using CVD, ALD, PEALD, or a suitable method.

Figure 23:
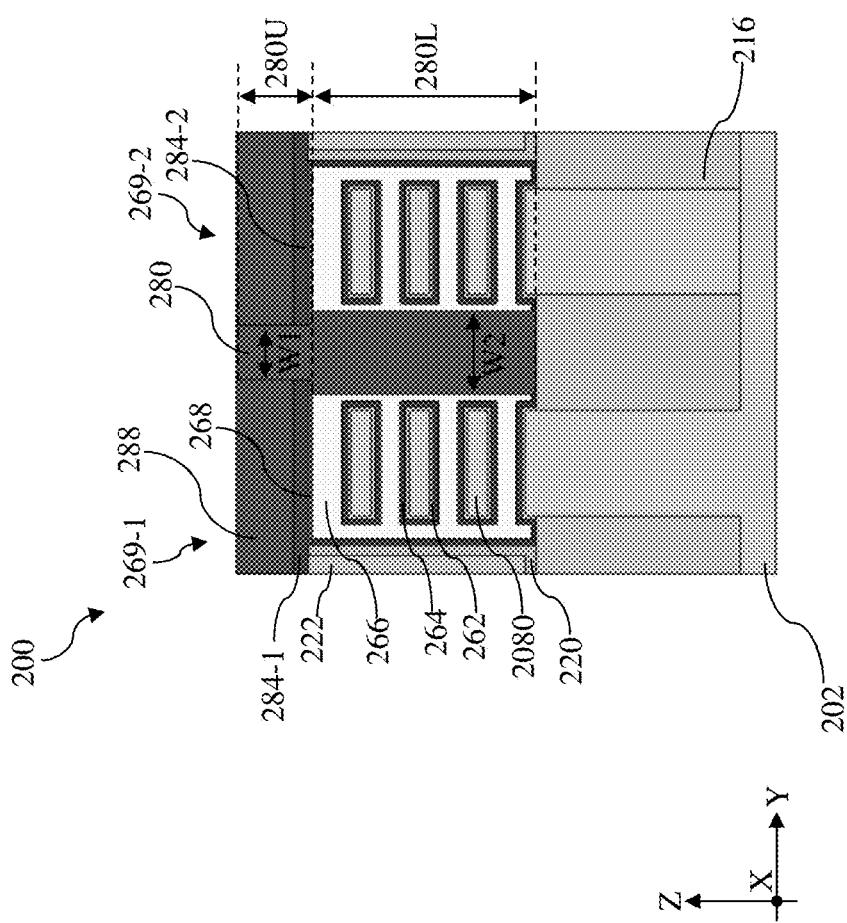
Figure 24:
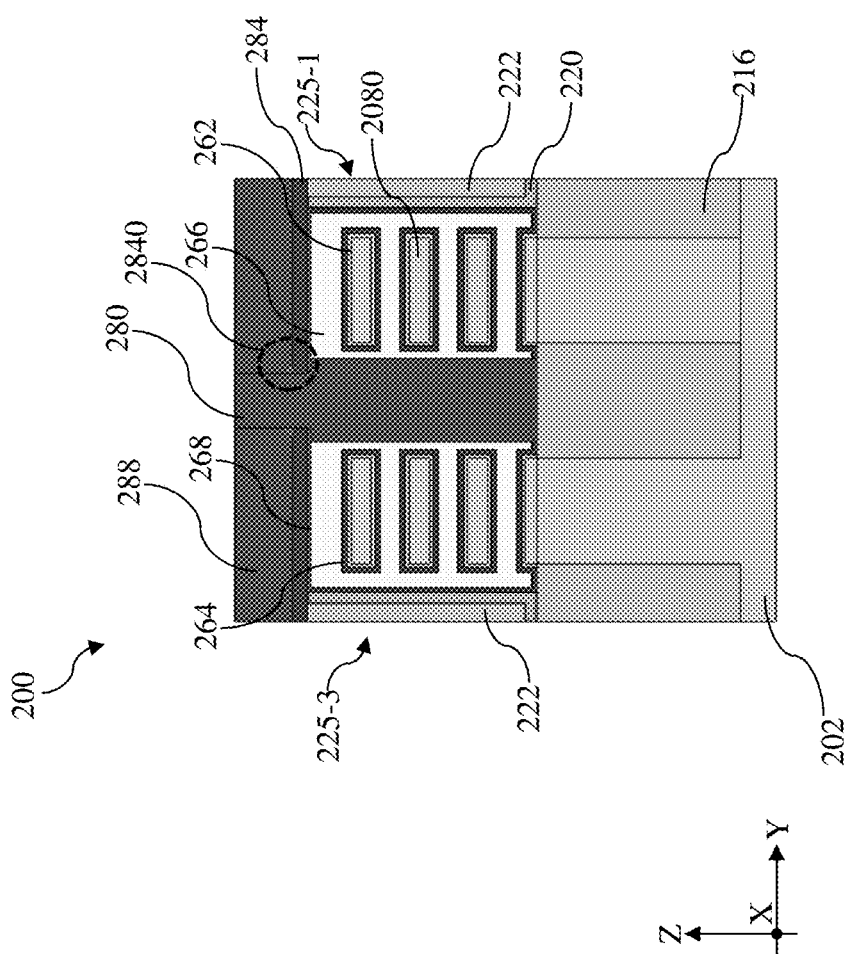

Reference is made to FIGS. 23 and 27. In some embodiments, the isolation structure 280 includes a lower portion 280L and an upper portion 280U disposed over the lower portion 280L. The lower portion 280L refers to the portion of the isolation structure 280 below the first metal layer 268 and the upper portion 280U refers to the portion of the isolation structure 280 above the first metal layer 268. In embodiments represented in FIG. 23, the lower portion 280L is disposed or sandwiched between the first gate structure 269-1 and the second gate structure 269-2. The upper portion 280U is disposed between the two separate portions of the first metal layer 268 as well as between the first segment 284-1 and the second segment 284-2. The upper portion 280U is also disposed between gate SAC dielectric layer 288. Along the Y direction, the upper portion 280U has a first width W1 and the lower portion 280L has a second width W2. Because of the undercutting when forming the isolation trench 274, the second width W2 is greater than the first width W1. In some instances, the first width W1 is between about 5 nm and about 50 nm and the second width W2 is between about 10 nm and about 60 nm. A different between the first width W1 and the second width W2 represents an extend of undercutting. In some instances, the difference between the first width W1 and the second width W2 may be between about 2 nm and about 20 nm. Put differently, the first metal layer 268, the second metal layer 284 (including the first segment 284-1 and the second segment 284-2), and the seed layer 282 (including the first portion 282-1 and the second portion 282-2, when formed) overhang the first gate structure 269-1 and the second gate structure 269-2. In embodiments represented in FIG. 27, the upper portion 280U is further disposed or sandwiched between the first portion 282-1 and the second portion 282-2 of the seed layer 282.

Figure 28:
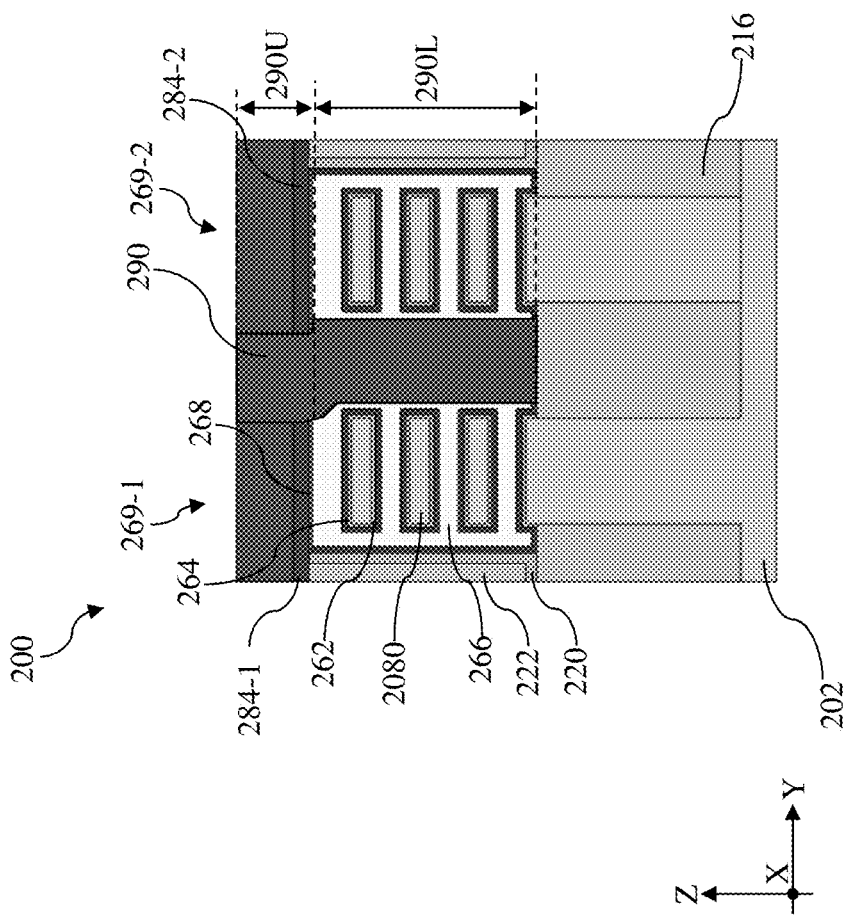

Due to process variation, the present disclosure provides alternative embodiments illustrated in FIGS. 28-31. Referring to FIG. 28, when the opening 272 (shown in FIG. 18) is not perfectly aligned with the second dielectric fin 225-2 along the Z direction, the removal of the second dielectric fin 225-2 may lead to formation of a crooked isolation structure 290. The crooked isolation structure 290 includes a lower portion 290L and an upper portion 290U over the lower portion 290L. As shown in FIG. 28, the upper portion 290U is not vertically aligned with the lower portion 290L along the Z direction. The lower portion 290L is substantially disposed between the first gate structure 269-1 and the second gate structure 269-2. The upper portion 290U is substantially disposed between the first segment 284-1 and the second segment 284-2. In some instances, the crooked isolation structure 290 cuts into the gate electrode layer 266 of one of the first gate structure 269-1 and the second gate structure 269-2.

Figure 29:
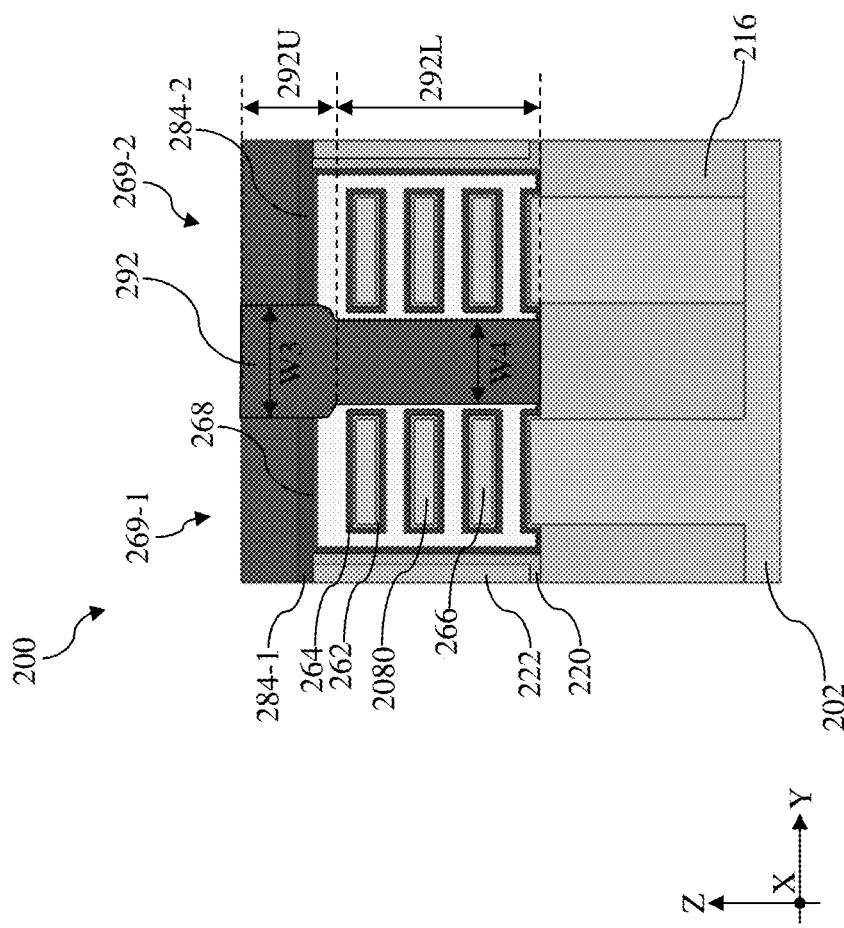

Referring to FIG. 29, when the opening 272 (shown in FIG. 18) is wider than the second dielectric fin 225-2 along the Y direction, the removal of the second dielectric fin 225-2 may lead to formation of a bolt-like isolation structure 292. The bolt-like isolation structure 292 includes a lower portion 292L and an upper portion 292U over the lower portion 292L. As shown in FIG. 29, the upper portion 292U has a third width W3 and the lower portion 292L has a fourth width W4 smaller than the third width W3. In some instances, the fourth width W4 may be between about 10 nm and about 60 nm and the third width W3 may be between about 20 nm and about 75 nm. The lower portion 292L is substantially disposed between the first gate structure 269-1 and the second gate structure 269-2. The upper portion 292U is substantially disposed between the first segment 284-1 and the second segment 284-2. In some instances, the upper portion 292U of the bolt-like isolation structure 292 cuts into the gate electrode layers 266 of the first gate structure 269-1 and the second gate structure 269-2.

Figure 30:
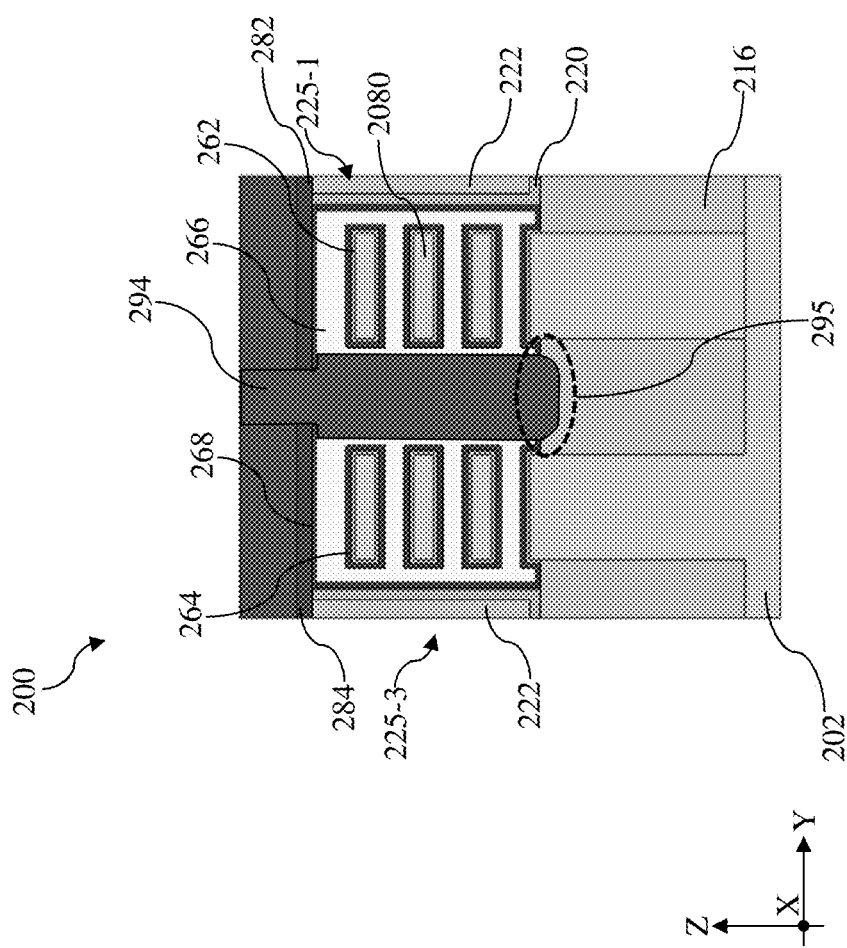

Referring to FIG. 30, when the removal of the second dielectric fin 225-2 etches into the isolation feature 216, a round-bottom isolation structure 294 may be formed. The round-bottom isolation structure 294 includes a bottom portion 295 that extends into the isolation feature 216. The bottom portion 295 may extend about 1 nm and about 20 nm into the isolation feature 216.

Figure 31:
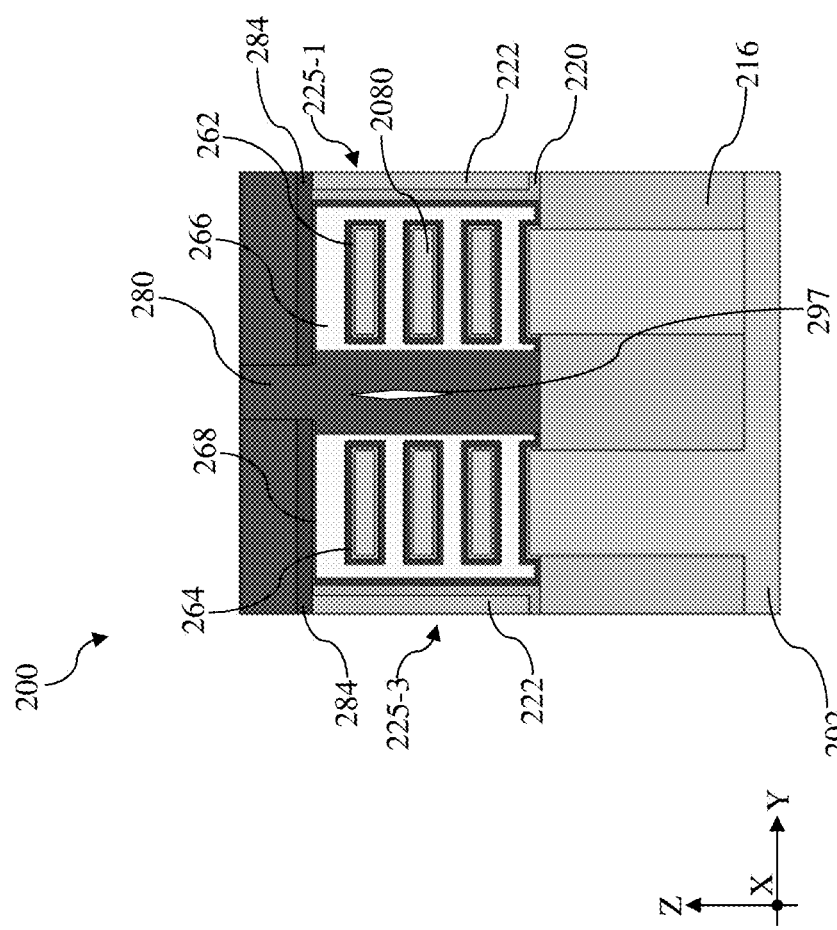

Referring to FIG. 31, when the deposition process for the isolation structure 280 does not have sufficient hole-filling ability, a void 297 may be formed in the isolation structure 280. When formed, the void 297 may have a width between about 1 nm and about 5 nm along the Y direction and a height between about 2 nm and about 20 nm along the Z direction.

Based on the above discussions, it can be seen that the present disclosure offers advantages over conventional processes. It is understood, however, that other embodiments may offer additional advantages, and not all advantages are necessarily disclosed herein, and that no particular advantage is required for all embodiments. For example, the processes disclosed in the present disclosure deposit gate structure layers over a dielectric fin and the dielectric fin is subsequently removed to form an isolation trench between gate structures. A dielectric material is then deposited into the isolation trench to form an isolation structure. Compared the dielectric fin, the isolation structure is wider along the direction between the gate structures to increase the gate-to-gate separation. The gate-to-gate separation leads to reduced gate-to-gate capacitance, which is advantageous.

In one exemplary aspect, the present disclosure is directed to a semiconductor device. The semiconductor device includes a first gate structure and a second gate structure aligned along a direction, a first metal layer disposed over the first gate structure, a second metal layer disposed over the second gate structure, and a gate isolation structure extending between the first gate structure and the second gate structure as well as between the first metal layer and the second metal layer.

In some embodiments, the gate isolation structure includes a void. In some implementations, the gate isolation structure includes a lower portion disposed between the first gate structure and the second gate structure and an upper portion disposed between the first metal layer and the second metal layer, and a width of the lower portion along the direction is greater than a width of the upper portion along the direction. In some instances, the semiconductor device may further include a first self-aligned contact (SAC) dielectric layer over the first metal layer and a second SAC dielectric layer over the second metal layer. The upper portion is further disposed between the first SAC dielectric layer and the second SAC dielectric layer. In some embodiments, the first gate structure is disposed between the gate isolation structure and a dielectric fin and the first metal layer extends over the dielectric fin. In some embodiments, the gate isolation structure is a single layer and the dielectric fin includes a liner and a fill layer over the liner. In some implementations, the semiconductor device may further include a third metal layer disposed between the first gate structure and the first metal layer and the dielectric fin is in direct contact with the first metal layer. In some instances, the semiconductor device may further include a seed layer sandwiched between the first metal layer and the third metal layer.

In another exemplary aspect, the present disclosure is directed to a semiconductor device. The semiconductor device may include a first plurality of channel members stacked vertically, a second plurality of channel members stacked vertically, a first gate structure disposed over and wrapping around each of the first plurality of channel members, the first gate structure having a first gate dielectric layer, and a first electrode layer over the first gate dielectric layer, a second gate structure disposed over and wrapping around each of the second plurality of channel members, the second gate structure having a second gate dielectric layer, and a second electrode layer over the second gate dielectric layer, a first metal layer disposed over the first gate structure, a second metal layer disposed over the second gate structure, and a gate isolation structure extending between the first gate structure and the second gate structure as well as between the first metal layer and the second metal layer. The gate isolation structure is direct contact with the first electrode layer and the second electrode layer.

In some embodiments, a portion of the first metal layer overhangs the first gate structure and a portion of the second metal layer overhangs the second gate structure. In some implementations, the gate isolation structure includes a lower portion disposed between the first gate structure and the second gate structure and the lower portion undercuts at least one of the first metal layer and the second metal layer. In some implementations, the first plurality of channel members are disposed over a first base portion arising from a substrate, the second plurality of channel members are disposed over a second base portion arising from the substrate, and a portion of the gate isolation structure extends into an isolation feature disposed between the first base portion and the second base portion. In some instances, the first gate structure is disposed between the gate isolation structure and a dielectric fin and the first metal layer extends over the dielectric fin. In some embodiments, the semiconductor device may further include a seed layer disposed between the first metal layer and the first gate structure and the seed layer extends over the dielectric fin.

In yet another exemplary aspect, the present disclosure is directed to a method. The method includes receiving a workpiece including a first dielectric fin, a second dielectric fin, and a third dielectric fin, a first gate structure disposed between the first dielectric fin and the second dielectric fin, and a second gate structure disposed between the second dielectric fin and the third dielectric fin, selectively depositing a first metal layer on the first gate structure and the second gate structure, selectively removing the second dielectric fin to form an isolation trench, and depositing a dielectric material in the isolation trench to form a gate isolation structure.

In some embodiments, the selectively removing of the second dielectric fin includes depositing a hard mask layer over the workpiece, patterning the hard mask layer to form an opening exposing the second dielectric fin, and etching the second dielectric fin through the opening to form the isolation trench. In some implementations, the method may further include after the depositing of the dielectric material, selectively removing the patterned hard mask layer to expose the first metal layer on the first gate structure and the second gate structure, and depositing a second metal layer over the first metal layer, the first dielectric fin, and the third dielectric fin. In some instances, the depositing of the second metal layer includes depositing the second metal layer over the first metal layer, the first dielectric fin, the third dielectric fin, and the gate isolation structure, and etching back the second metal layer to remove the second metal layer on the gate isolation structure. In some implementations, the depositing of the second metal layer includes depositing a seed layer over the first metal layer, the first dielectric fin, the third dielectric fin, and the gate isolation structure, etching back the seed layer to remove the seed layer on the gate isolation structure, and after the etching back, selectively depositing the second metal layer on the seed layer. In some instances, the first gate structure includes a first gate dielectric layer. The second gate structure includes a second gate dielectric layer and the selectively removing of the second dielectric fin also removes a portion of the first gate dielectric layer and a portion of the second gate dielectric layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first gate structure and a second gate structure aligned along a direction;
a first metal layer disposed over the first gate structure;
a second metal layer disposed over the second gate structure;
a gate isolation structure extending between the first gate structure and the second gate structure as well as between the first metal layer and the second metal layer; and
a first dielectric fin adjacent the first gate structure,
wherein the first gate structure is disposed between the first dielectric fin and the gate isolation structure,
wherein the first metal layer spans over a top surface of the first dielectric fin.

2. The semiconductor device of claim 1, wherein the gate isolation structure comprises a void.

3. The semiconductor device of claim 1,
wherein the gate isolation structure comprises a lower portion disposed between the first gate structure and the second gate structure and an upper portion disposed between the first metal layer and the second metal layer,
wherein a width of the lower portion along the direction is greater than a width of the upper portion along the direction.

4. The semiconductor device of claim 3, further comprising:
a first self-aligned contact (SAC) dielectric layer over the first metal layer; and
a second SAC dielectric layer over the second metal layer,
wherein the upper portion is further disposed between the first SAC dielectric layer and the second SAC dielectric layer.

5. The semiconductor device of claim 1,
wherein the second gate structure is disposed between the gate isolation structure and a second dielectric fin,
wherein the second metal layer extends over the second dielectric fin.

6. The semiconductor device of claim 5,
wherein the gate isolation structure is a single layer,
wherein the second dielectric fin comprises a liner and a fill layer over the liner.

7. The semiconductor device of claim 1, further comprising:
a third metal layer disposed between the first gate structure and the first metal layer,
wherein the first dielectric fin is in direct contact with the first metal layer.

8. The semiconductor device of claim 7, further comprising:
a seed layer sandwiched between the first metal layer and the third metal layer.

9. A semiconductor device, comprising:
a first plurality of channel members stacked vertically;
a second plurality of channel members stacked vertically;
a first gate structure disposed over and wrapping around each of the first plurality of channel members, the first gate structure comprising:
a first gate dielectric layer, and
a first electrode layer over the first gate dielectric layer;
a second gate structure disposed over and wrapping around each of the second plurality of channel members, the second gate structure comprising:
a second gate dielectric layer, and
a second electrode layer over the second gate dielectric layer;
a first metal layer disposed over the first gate structure;
a second metal layer disposed over the second gate structure; and
a gate isolation structure extending between the first gate structure and the second gate structure as well as between the first metal layer and the second metal layer, wherein the gate isolation structure comprises a lower portion disposed between the first plurality of channel members and the second plurality of channel members,
wherein the lower portion of the gate isolation structure is direct contact with the first electrode layer and the second electrode layer,
wherein the lower portion is disposed between the first gate structure and the second gate structure,
wherein the lower portion undercuts at least one of the first metal layer and the second metal layer.

10. The semiconductor device of claim 9,
wherein a portion of the first metal layer overhangs the first gate structure,
wherein a portion of the second metal layer overhangs the second gate structure.

11. The semiconductor device of claim 9,
wherein the first plurality of channel members are disposed over a first base portion arising from a substrate,
wherein the second plurality of channel members are disposed over a second base portion arising from the substrate,
wherein a portion of the gate isolation structure extends into an isolation feature disposed between the first base portion and the second base portion.

12. The semiconductor device of claim 9,
wherein the first gate structure is disposed between the gate isolation structure and a dielectric fin,
wherein the first metal layer extends over the dielectric fin.

13. The semiconductor device of claim 12, further comprising:
a seed layer disposed between the first metal layer and the first gate structure,
wherein the seed layer extends over the dielectric fin.

14. The semiconductor device of claim 9, wherein the first metal layer and the second metal layer comprise titanium, titanium nitride, tantalum nitride, tungsten, ruthenium, aluminum, cobalt, or nickel.

15. A method, comprising:
receiving a workpiece comprising:
a first dielectric fin, a second dielectric fin, and a third dielectric fin,
a first gate structure disposed between the first dielectric fin and the second dielectric fin, and
a second gate structure disposed between the second dielectric fin and the third dielectric fin;
selectively depositing a first metal layer on the first gate structure and the second gate structure;
selectively removing the second dielectric fin to form an isolation trench; and
depositing a dielectric material in the isolation trench to form a gate isolation structure.

16. The method of claim 15, wherein the selectively removing of the second dielectric fin comprises:
depositing a hard mask layer over the workpiece;
patterning the hard mask layer to form an opening exposing the second dielectric fin; and
etching the second dielectric fin through the opening to form the isolation trench.

17. The method of claim 16, further comprising:
after the depositing of the dielectric material, selectively removing the patterned hard mask layer to expose the first metal layer on the first gate structure and the second gate structure; and
depositing a second metal layer over the first metal layer, the first dielectric fin, and the third dielectric fin.

18. The method of claim 17, wherein the depositing of the second metal layer comprises:
depositing the second metal layer over the first metal layer, the first dielectric fin, the third dielectric fin, and the gate isolation structure; and
etching back the second metal layer to remove the second metal layer on the gate isolation structure.

19. The method of claim 17, wherein the depositing of the second metal layer comprises:
depositing a seed layer over the first metal layer, the first dielectric fin, the second dielectric fin, and the gate isolation structure;
etching back the seed layer to remove the seed layer on the gate isolation structure; and
after the etching back, selectively depositing the second metal layer on the seed layer.

20. The method of claim 15,
wherein the first gate structure comprises a first gate dielectric layer,
wherein the second gate structure comprises a second gate dielectric layer,
wherein the selectively removing of the second dielectric fin also removes a portion of the first gate dielectric layer and a portion of the second gate dielectric layer.

* * * * *

UNITED STATES PATENT AND TRADEMARK OFFICE
CERTIFICATE OF CORRECTION

| | |
|---|---|
| PATENT NO. | : 11,450,662 B2 |
| APPLICATION NO. | : 16/952812 |
| DATED | : September 20, 2022 |
| INVENTOR(S) | : Jia-Chuan You et al. |

It is certified that error appears in the above-identified patent and that said Letters Patent is hereby corrected as shown below:

On the Title Page

In the Related U.S. Application Data Section at Item (60):
Provisional application No. "63/306,654" should read --63/063,654--.

Signed and Sealed this
Seventh Day of May, 2024

Katherine Kelly Vidal
*Director of the United States Patent and Trademark Office*